(12) United States Patent
Lee et al.

(10) Patent No.: US 9,299,717 B2
(45) Date of Patent: Mar. 29, 2016

(54) SEMICONDUCTOR DEVICE

(71) Applicant: SK hynix Inc., Gyeonggi-do (KR)

(72) Inventors: Ki Hong Lee, Gyeonggi-do (KR); Seung Ho Pyi, Gyeonggi-do (KR); Yong Hyun Lim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 43 days.

(21) Appl. No.: 14/024,248

(22) Filed: Sep. 11, 2013

(65) Prior Publication Data

US 2014/0346682 A1    Nov. 27, 2014

(30) Foreign Application Priority Data

May 23, 2013 (KR) .................. 10-2013-0058365

(51) Int. Cl.
*H01L 23/535* (2006.01)
*H01L 27/115* (2006.01)

(52) U.S. Cl.
CPC ...... *H01L 27/11582* (2013.01); *H01L 27/1157* (2013.01); *H01L 27/11565* (2013.01); *H01L 27/11573* (2013.01)

(58) Field of Classification Search
CPC .......................... H01L 23/535; H01L 23/481
USPC ....................................................... 257/776
See application file for complete search history.

(56) References Cited

U.S. PATENT DOCUMENTS

2013/0127011 A1* 5/2013 Higashitani et al. .......... 257/532
2014/0077285 A1* 3/2014 Noda et al. .................... 257/324

FOREIGN PATENT DOCUMENTS

| KR | 1020100042454 | 4/2010 |
|----|---------------|--------|
| KR | 1020110049876 | 5/2011 |
| KR | 101107343     | 1/2012 |
| KR | 101119875     | 4/2012 |
| KR | 1020130006272 | 1/2013 |

* cited by examiner

*Primary Examiner* — Matthew W Such
*Assistant Examiner* — Warren H Kilpatrick
(74) *Attorney, Agent, or Firm* — IP & T Group LLP

(57) ABSTRACT

A semiconductor device includes a plurality of first conductive layers stacked on top of one another, a plurality of first slits passing through the first conductive layers, and a plurality of second slits passing through the first conductive layers and crossing end portions of the first slits to form cross-shaped edges.

20 Claims, 27 Drawing Sheets

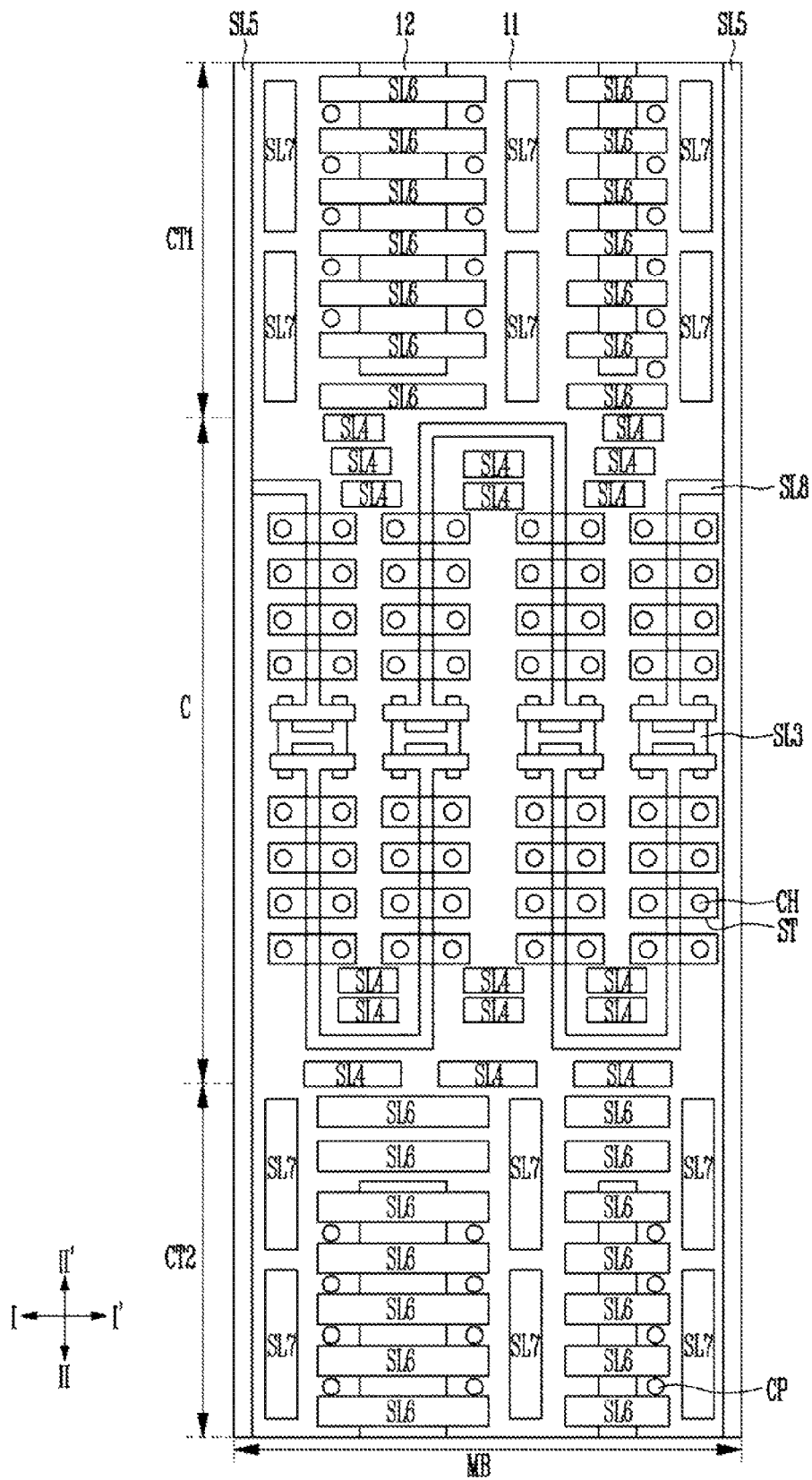

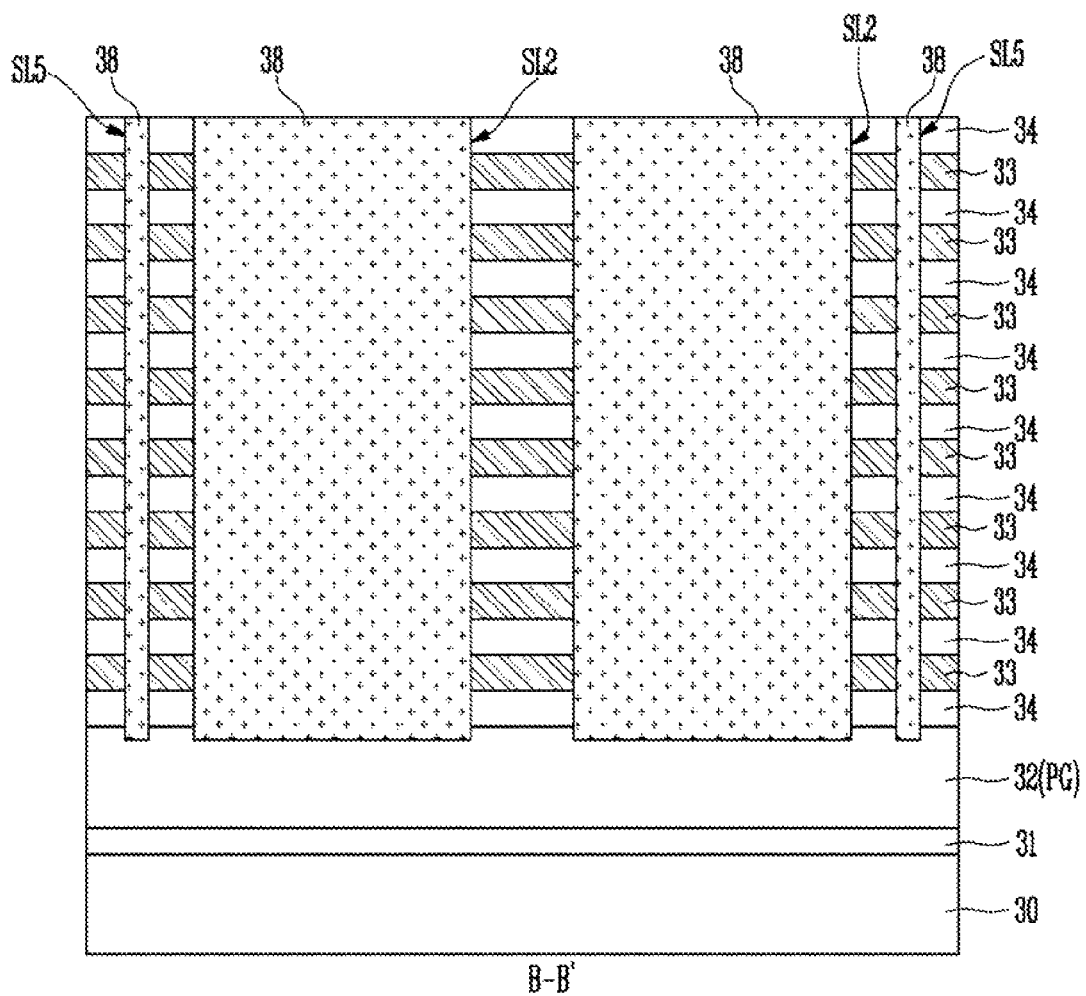

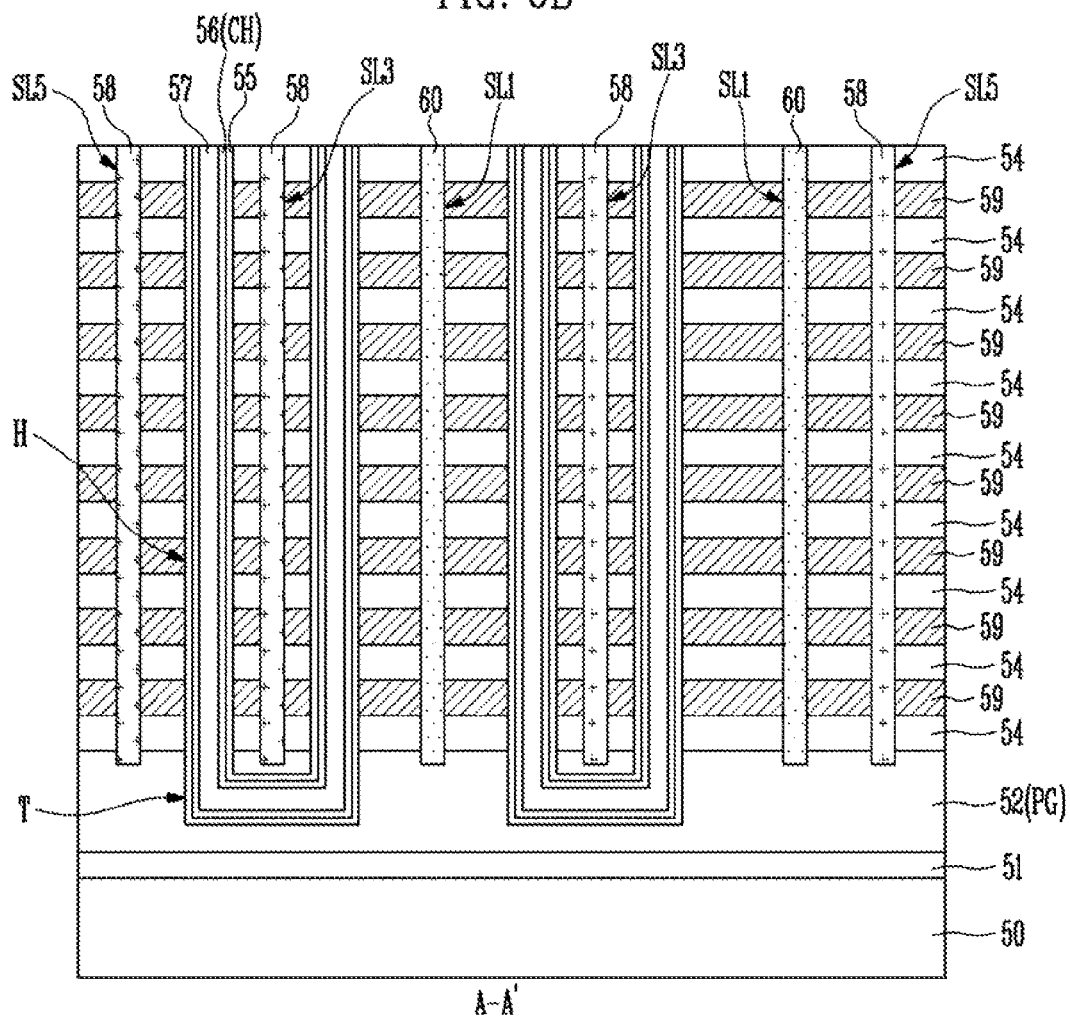

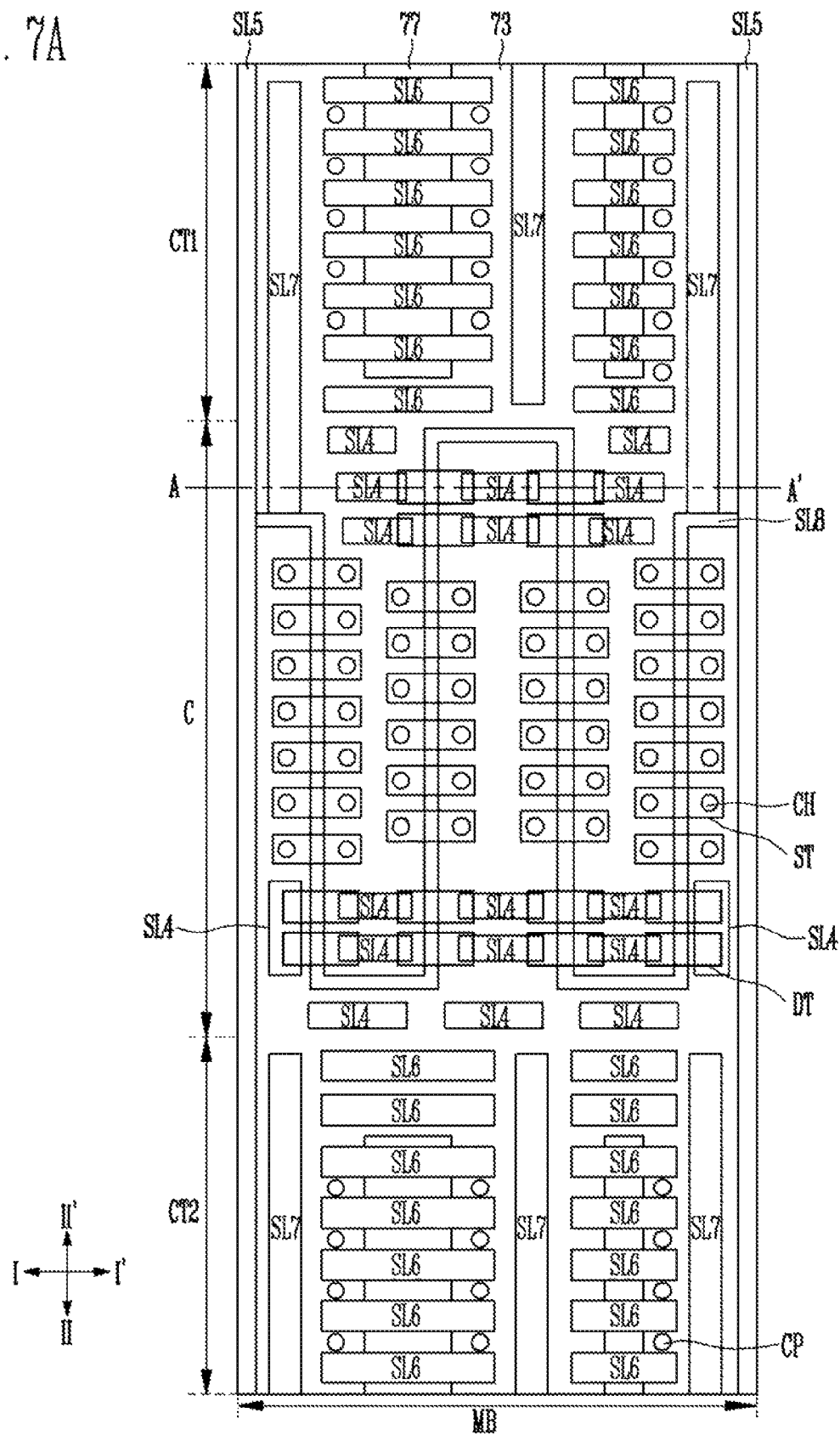

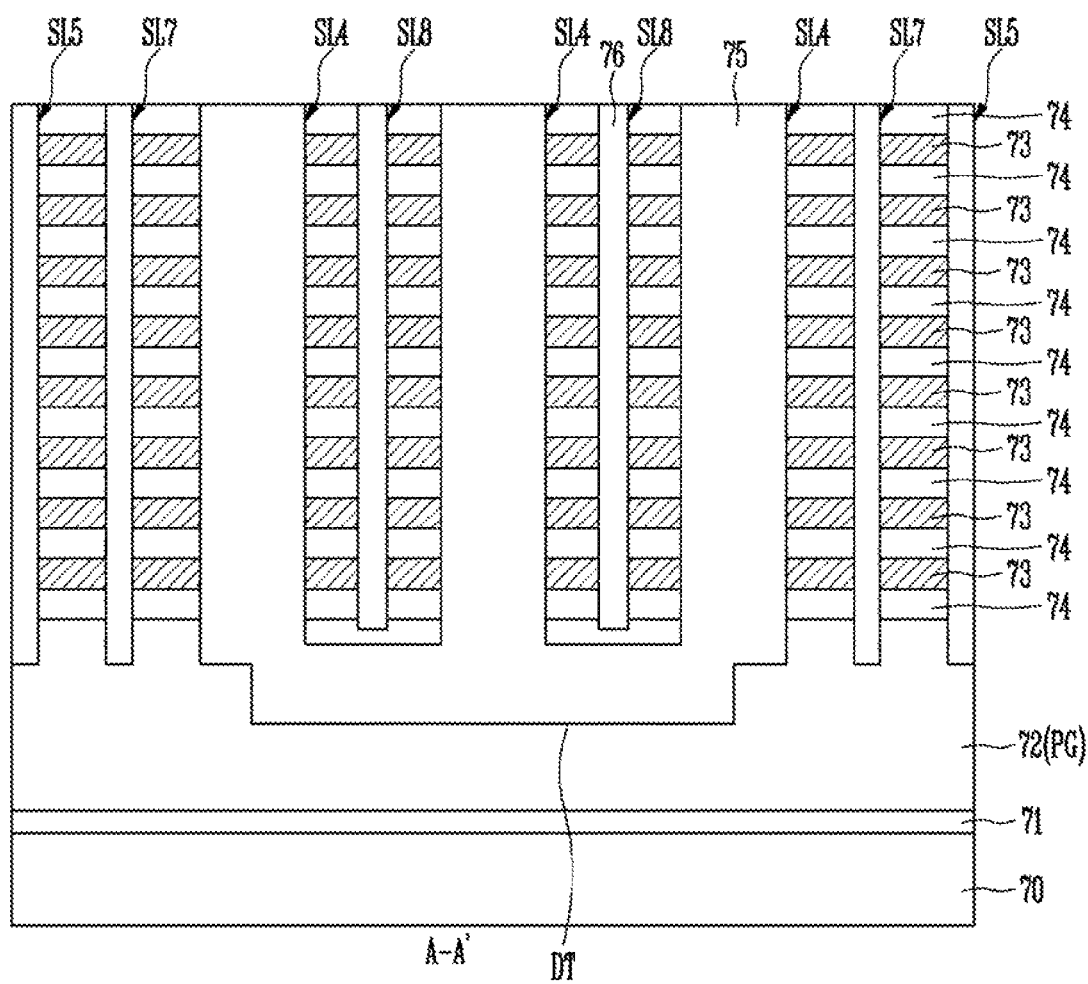

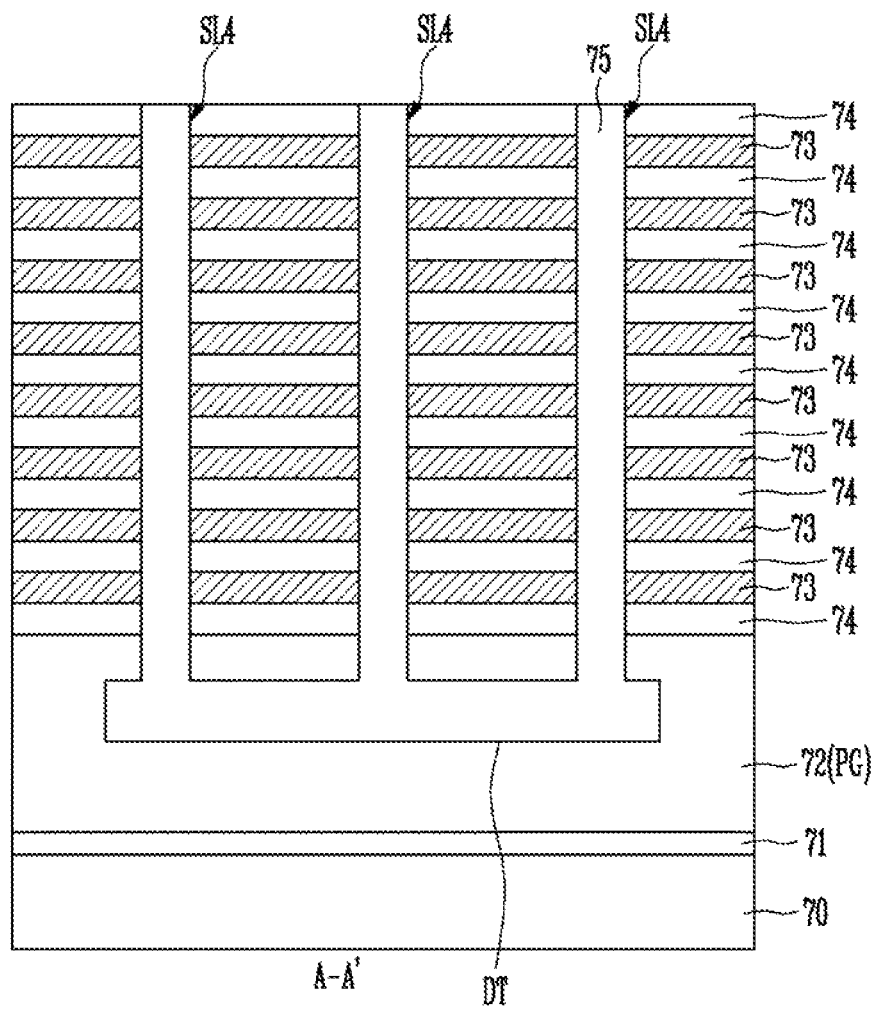

SEMICONDUCTOR DEVICE

CROSS-REFERENCE TO RELATED APPLICATION

The present application claims priority of to Korean patent application number 10-2013-0058365, filed on May 23, 2013, the entire disclosure of which is incorporated herein by reference in its entirety.

BACKGROUND

1. Field of Invention

The present invention relates to a semiconductor device, and more particularly, to a 3-dimensional semiconductor device.

2. Description of Related Art

A non-volatile memory device is a memory device in which stored data is maintained as it is even though power supply is blocked. Improvement of integration of a 2-dimensional memory device in which a memory cell is formed as a single layer on a silicon substrate has recently reached a limitation, so a 3-dimensional non-volatile memory device in which a plurality of memory cells are vertically stacked on a silicon substrate has been suggested.

The 3-dimensional non-volatile memory device simultaneously forms a plurality of memory cells by using laminates. However, in a process of forming a slit passing through the laminates, there incurs a concern in that the laminates are inclined or collapsed. Further, tensile stress may be generated in a process of forming an insulation layer within the slit, thereby damaging peripheral layers.

BRIEF SUMMARY

Exemplary embodiments of the present invention are directed to a semiconductor device having a stable structure.

An exemplary embodiment of the present invention provides a semiconductor device that may include a plurality of first conductive layers stacked on top of one another, a plurality of first slits passing through the first conductive layers, and a plurality of second slits passing through the first conductive layers and crossing end portions of the first slits to form cross-shaped edges.

Another exemplary embodiment of the present invention provides a semiconductor device that may include a substrate in which a cell area and a contact area are defined, a plurality of conductive layers stacked on the substrate, and a plurality of slits positioned between adjacent memory blocks, passing through the conductive layers and including one or more protrusions positioned at the contact area.

Yet another exemplary embodiment of the present invention provides a semiconductor device that may include a first conductive layer, a plurality of second conductive patterns stacked on the first conductive layer, a first slit isolating the second conductive patterns from each other, a plurality of dummy trenches formed within the first conductive layer, and a plurality of second slits connected with the dummy trenches, passing through the plurality of second conductive patterns and positioned with the first slit interposed therebetween.

According to the embodiment of the present invention, it may be possible to prevent laminates of a semiconductor device from being inclined or collapsed and to prevent peripheral layers from being damaged due to tensile stress. Accordingly, it may be possible to provide a semiconductor device having a stable structure.

The foregoing summary is illustrative only and is not intended to be limited in any way. Embodiments and features described above will become apparent by reference to the drawings and the following detailed description.

BRIEF DESCRIPTION OF THE DRAWINGS

The above and other features and advantages of the present invention will become more apparent to those of ordinary skill in the art by describing in detailed embodiments thereof with reference to the attached drawings in which:

FIGS. 2A to 2D are layout diagrams of a semiconductor device according to the embodiment of the present invention;

FIGS. 3A to 3C, and FIGS. 4A to 4C are views illustrating a method of manufacturing the semiconductor device according to the embodiment of the present invention;

FIGS. 5A to 5C, and FIGS. 6A to 6C are views illustrating the method of manufacturing the semiconductor device according to the embodiment of the present invention;

FIGS. 7A and 7B are views illustrating a structure of a semiconductor device according to an embodiment of the present invention;

FIGS. 8A and 8B are views illustrating a structure of a semiconductor device according to an embodiment of the present invention;

FIGS. 9A and 9B are views illustrating a structure of a semiconductor device according to an embodiment of the present invention;

DETAILED DESCRIPTION

Figure 1A:
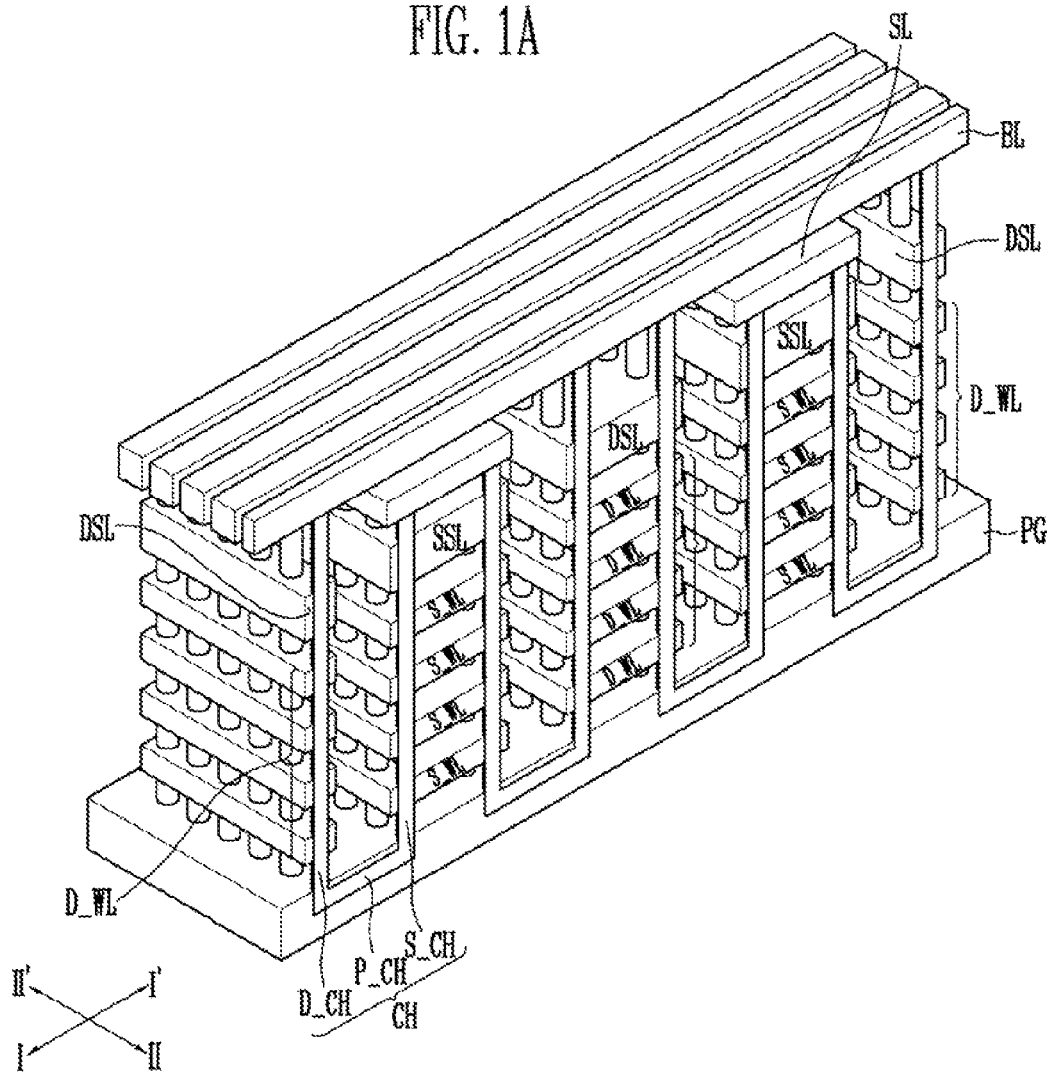
FIGS. 1A and 1B are views illustrating a structure of a semiconductor device according to an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1a is a perspective view illustrating a structure of a semiconductor device according to an embodiment of the present invention, and illustrates the semiconductor device based on a cell area while omitting interlayer insulation layers for convenience of description.

As illustrated in FIG. 1A, the semiconductor device according to the embodiment of the present invention includes U-shaped channel layers CH arranged in a first direction I-I' and a second direction II-II' crossing the first direction I-I'. Here, each of the channel layers CH includes a source side channel layer S_CH, a drain side channel layer D_CH, and a pipe channel layer P_CH connected with the source side channel layer S_CH and the drain side channel layer D_CH.

The semiconductor device further includes a pipe gate PG surrounding the pipe channel layer P_CH, source side word lines S_WL stacked on the pipe gate PG while surrounding the source side channel layer S_CH, drain side word lines D_WL stacked on the pipe gate PG while surrounding the drain side channel layer D_CH, one or more source selection lines SSL stacked on the source side word lines S_WL while surrounding the source side channel layer S_CH, and one or more drain selection lines DSL stacked on the drain side word lines D_WL while surrounding the drain side channel layer D_CH.

In FIG. 1A, the source side word lines S_WL and the drain side word lines D_WL are illustrated in a form of a line extended in a direction parallel with the second direction II-II'. However, the lines formed on the same layer may be connected with each other. For example, the source side word lines S_WL and the drain side word lines D_WL may have an interlaced finger configuration (see FIG. 1B).

The semiconductor device may further include memory layers (not shown) interposed between the channel layers CH and the word lines S_WL and D_WL. Here, each of the memory layers includes a tunnel insulation layer, a data storing layer, and a charge blocking layer. Further, the data storing layer may include at least one of a charge trap layer, such as a nitride layer, a floating gate, such as a polysilicon layer, a nanodot, and a phase change material layer.

Further, the semiconductor device further includes source lines SL connected with the source side channel layer S_CH, and bit lines BL connected with the drain side channel layer D_CH.

According to the aforementioned structure, drain selection transistors DST are formed in areas at which the channel layers CH cross the drain selection lines DSL, source selection transistors SST are formed in areas at which the channel layers CH cross the source selection lines SSL, source side memory cells MC are formed in areas at which the channel layers CH cross the source side word lines S_WL, drain side memory cells MC are formed in areas at which the channel layers CH cross the drain side word lines D_WL, and pipe transistors are formed in areas at which the channel layers CH cross the pipe gate PG.

Further, one string may include one or more drain selection transistors, the drain side memory cells, the pipe transistor, the source side memory cells, and one or more source selection transistors, which are serially connected with each other, and the strings are arranged in a U-shape.

Figure 1B:
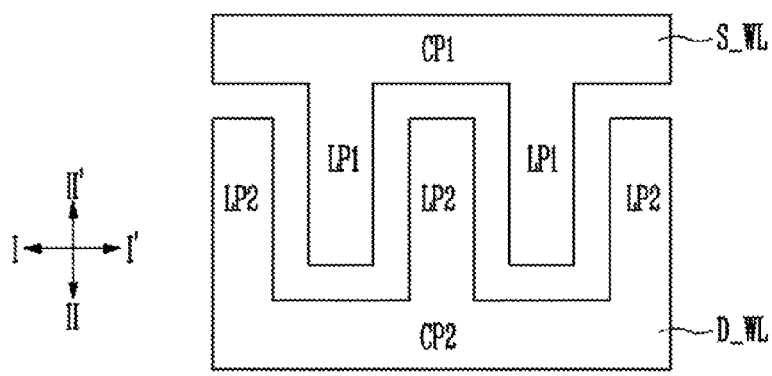

FIG. 1B is a layout diagram of the source side word lines S_WL and the drain side word lines D_WL.

As illustrated in FIG. 1B, the source side word lines S_WL include first line patterns LP1 extended in a direction parallel with the second direction II-II', and a first connection pattern CP1 connecting end portions of the first line patterns LP1. Further, the drain side word lines D_WL include second line patterns LP2 extended in a direction parallel with the second direction II-II', and a second connection pattern CP2 connecting end portions of the second line patterns LP2. Here, the first line patterns LP1 and the second line patterns LP2 are alternately arranged. Accordingly, the source side word lines S_WL and the drain side word lines D_WL may have an interlaced finger configuration.

Figure 2A:
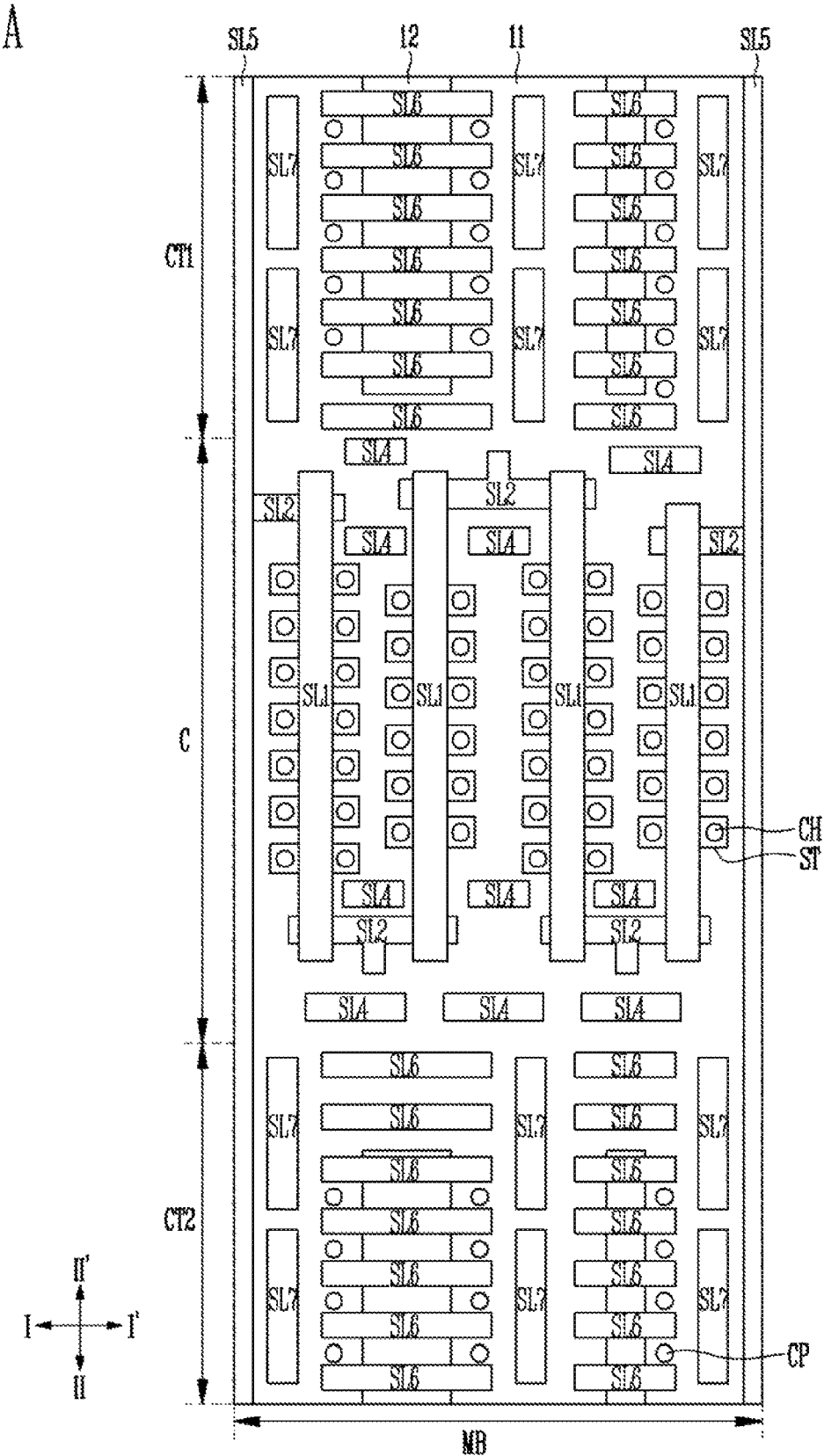

FIG. 2A is a layout diagram of the semiconductor device according to the embodiment of the present invention that has been described with reference to FIG. 1A.

As illustrated in FIG. 2A, the semiconductor device according to the embodiment of the present invention may include conductive layers 11 stacked on a substrate (not shown).

A cell area C, a first contact area CT1, and a second contact area CT2 are defined on the substrate. Here, the first contact areas CT1 may be positioned at one side of the cell region C, and the second contact area CT2 may be positioned at the other side of the cell region C.

The conductive layers 11 may include a first conductive layer and a plurality of second conductive layers staked on the first conductive layer. For example, the first conductive layer is the pipe gate, and at least one uppermost second conductive layer is the drain selection line DSL or the source selection line SSL, and the remaining second conductive layers may be the drain side word line D_WL or the source side word line S_WL.

Further, sacrificial layers 12 may be stacked on portions of the first and second contact areas CT1 and CT2 instead of the conductive layers 11. Further, insulation layers (not shown) are interposed between the stacked conductive layers 11 and between the stacked sacrificial layers 12.

For reference, pad portions, which are areas for connecting contact plugs CP, are defined on each conductive layer 11, and the pad portions are positioned in the first and second contact areas CT1 and CT2. For example, the conductive layers 11 stacked on the first and second contact areas CT1 and CT2 are patterned in a step shape, and the pad portions may be defined at exposed end portions of the conductive layers 11.

The semiconductor device further includes strings ST positioned at the cell area C. Here, the strings ST are arranged in the first direction I-I' and the second direction II-II'. The strings ST may be arranged in a matrix form at a predetermined interval, or may be arranged in a staggered form in which centers of the strings ST are offset, or may be arranged in a form of a combination thereof. Also, the strings ST may be arranged in a direction parallel with the first direction I-I' or may be arranged in a direction having predetermined angle with respect to the first direction I-I'. Further, the strings ST arranged in the second direction II-II' forms one string row. The present embodiment illustrates one memory block MB that includes four string rows and strings ST, which are included in the string rows and are arranged in a staggered form so that centers of the strings ST are offset.

The semiconductor device further includes at least one of first, second, fourth, fifth, sixth and seventh slits SL1, SL2, SL4, SL5, SL6 and SL7. Here, the first, second, fourth, fifth, sixth and seventh slits SL1, SL2, SL4, SL5, SL6 and SL7 are formed to pass through the stacked conductive layers 11 or the stacked sacrificial layers 12. Further, the slits arranged within each memory block MB are left-and-right symmetrically arranged or left-and-right asymmetrically arranged or up-and-down symmetrically arranged or up-and-down asymmetrically arranged. For reference, the first, second, fourth, fifth, sixth and seventh slits SL1, SL2, SL4, SL5, SL6 and SL7 may be formed at the same time or at different times. For example, the second, fourth, fifth and sixth slits SL2, SL4, SL5 and SL6 are first formed, and then the first and seventh slits SL1 and SL7 are secondarily formed.

The first and second slits SL1 and SL2 are formed to pass through at least some of the conductive layers 11. Here, the first slits SL1 positioned at the cell area C, have a line shape and are extended in a direction parallel with the second direction II-II'. The second slits SL2 are positioned at an edge of the cell area C adjacent to the contact area CT, and are extended in a direction parallel with the first direction I-I' to cross the end portions of the first slits SL1. According to the aforementioned structure, the second slits SL2 cross the end portions of the first slits SL1 to form cross-shaped edges.

Further, the both end portions of the first slits SL1 are connected with the second slits SL2 positioned at the edges of the both sides of the cell area C, and one second slit SL2 is connected with two first slits SL1. According to the aforementioned structure, the first slits SL1 are connected with the second slits SL2 to form a curved line shape. Accordingly, the conductive layers 11 of the cell area C are patterned in the shape of interlaced fingers.

Here, each of the first and second slits SL1 and SL2 may include one or more protrusions. For example, the second slits SL2 include one or more protrusions protruding toward the adjacent contact area CT. Further, the second slit SL2 positioned at the boundary between the adjacent memory blocks MB may be connected with the fifth slit SL5.

The fourth slits SL4 are positioned in the cell area C or edges of the cell area C adjacent to the first and second contact areas CT1 and CT2. Here, the fourth slits SL4 may be positioned between the first slits SL1. Especially, the fourth slits SL4 may be positioned at end portions of the line patterns of the conductive layers 11, having the finger shape. For example, the fourth slits SL4 may be positioned at the end portions of the line patterns adjacent to the connection patterns, or may be positioned at the end portions of the line patterns spaced apart from the connection patterns. The fourth slits SL4 may have an island shape having a plane shaped like a quadrangle, a polygon, a circle, an oval, a cross, a rhombus, and the like. Further, although it is not illustrated in the present drawing, the fourth slit SL4 positioned at the boundary between the adjacent memory blocks MB may be connected with the fifth slit SL5.

The fifth slits SL5 are positioned at the boundary between the adjacent memory blocks MB, and have a line shape extended in the second direction II-II'. Here, the fifth slits SL5 may further include one or more protrusions (not shown) protruding toward an inside of the memory block MB.

The sixth and seventh slits SL6 and SL7 are positioned within the first and second contact areas CT1 and CT2. For example, the sixth slits SL6 may have a line shape extended in the first direction I-I', and the seventh slits SL7 may have a line shape extended in the second direction II-II'. Further, each of the sixth and seventh slits SL6 and SL7 may include one or more protrusions. In the present drawing, a case, in which the sixth slits SL6 and the seventh slits SL7 are positioned apart from each other, is illustrated. However, the sixth slits SL6 and the seventh slits SL7 may be positioned to cross each other. Further, the sixth slits SL6 and the seventh slits SL7 may have the same or different lengths.

For reference, the slits positioned at the first contact area CT1 and the slits positioned at the second contact area CT2 may be symmetrically or asymmetrically arranged. Further, the number of slits arranged within the first contact area CT1 may be the same as or be different from the number of slits arranged within the second contact area CT2. In addition, widths and lengths of the slits may be changed as necessary.

Figure 2B:
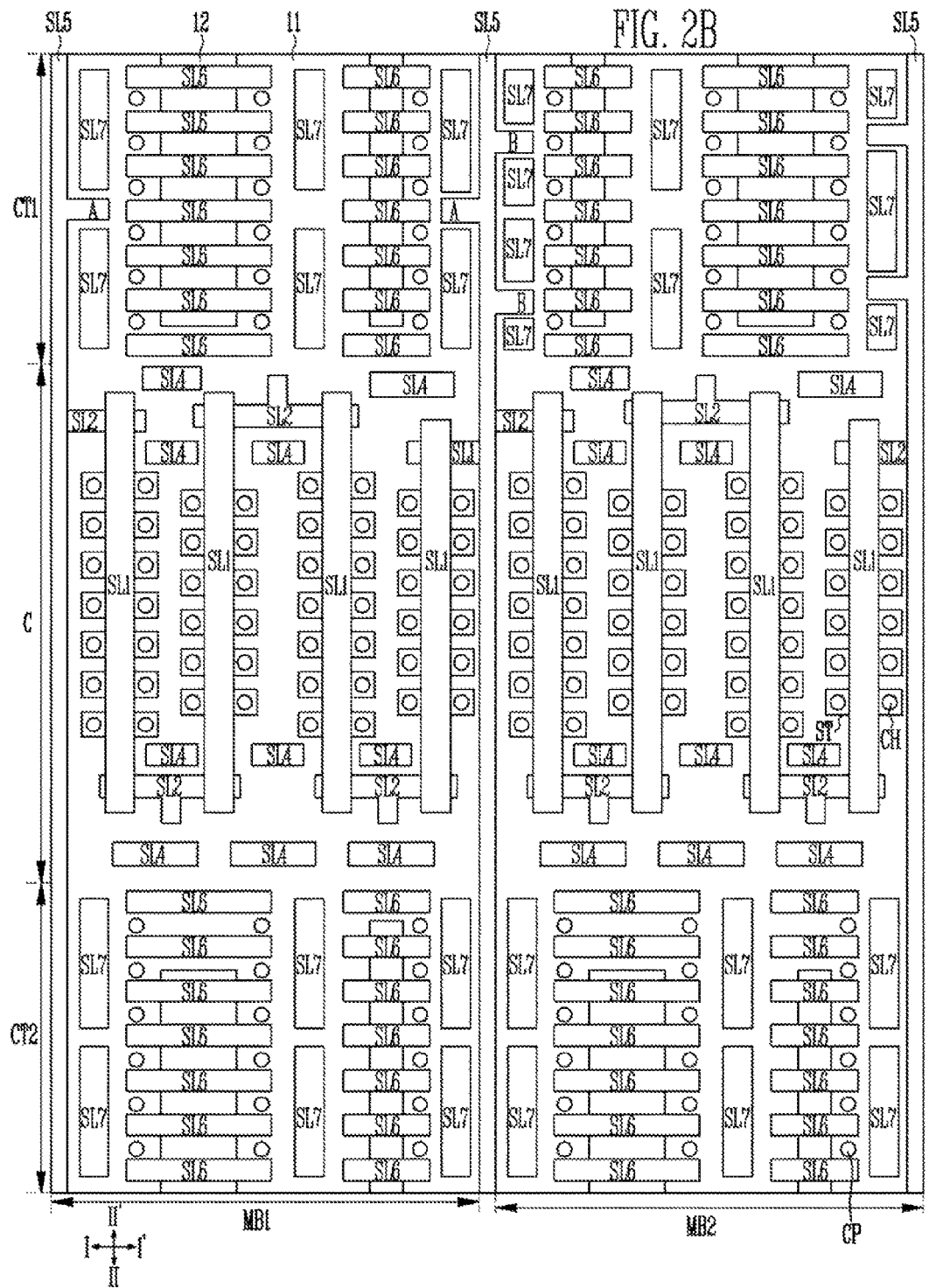

FIG. 2B is a layout diagram of the semiconductor device according to the embodiment of the present invention that has been described with reference to FIG. 1A. Hereinafter, contents already described in the aforementioned description will be omitted.

As illustrated in FIG. 2B, the semiconductor device according to the embodiment of the present invention includes the first and second memory blocks MB1 and MB2. The first, second, fourth, fifth, sixth and seventh slits SL1, SL2, SL4, SL5, SL6 and SL7 are arranged within the respective memory blocks MB1 and MB2. Here, the slits positioned within the first memory block MB1 and the slits positioned within the second memory block MB2 may be symmetrically or asymmetrically arranged.

For example, the fifth slit SL5 positioned at the boundary between the first memory block MB1 and the second memory block MB2 includes one or more first protrusions A protruding toward the inside of the first memory block MB1 and one or more second protrusions B protruding toward the inside of the second memory block MB2. Here, the first and second protrusions A and B may be positioned at one or more of the first and second contact areas CT1 and CT2. Further, the number of first protrusions A included in one fifth slit SL5 may be the same as or different from the number of second protrusions B, and the first protrusions A and the second protrusions B may be symmetrically or asymmetrically arranged.

FIG. 2B illustrates a case in which the number of first protrusions A is different from the number of second protrusions B, and the first protrusions A and the second protrusions B are asymmetrically arranged. As described above, when the first and second protrusions A and B are asymmetrically arranged at both sides of the fifth slit SL5, it may be possible to decrease tensile stress caused in a process of forming the insulation layer in the fifth slit SL5.

For reference, according to the positions of the first and second protrusions A and B, positions or shapes of other slits may be changed. For example, lengths or the number of seventh slits SL7 positioned to be adjacent to the boundary between the memory blocks MB1 and MB2 are changed according to the positions of the protrusions A and B. When the number of first protrusions A is one, two seventh slits SL7 are arranged with the first protrusion A interposed therebetween. When the number of second protrusions B is two, three seventh slits SL7 are arranged with the second protrusions B interposed therebetween.

Figure 2C:
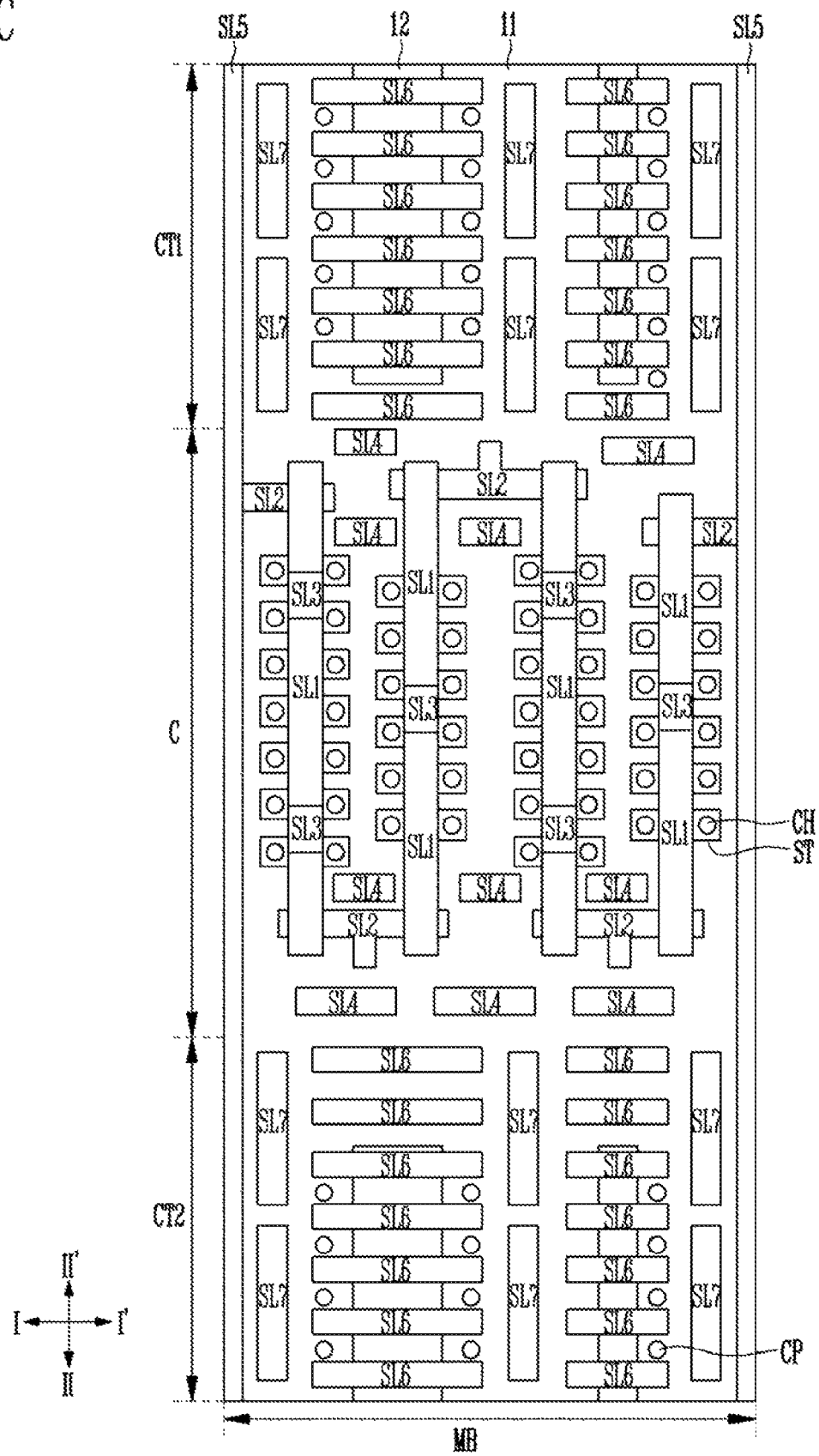

FIG. 2C is a layout diagram of the semiconductor device according to the embodiment of the present invention that has been described with reference to FIG. 1A. Hereinafter, contents already described in the aforementioned description will be omitted.

As illustrated in FIG. 2C, the semiconductor device according to the embodiment of the present invention includes one or more slits among the first to seventh slits SL1 to SL7.

Here, the third slits SL3 are positioned in the cell area C, and are positioned between the first slits SL1. Especially, the third slits SL3 may be positioned between the channel layers CH. For example, each third slit SL3 is positioned between the channel layers CH forming one string ST.

The first and third slits SL1 and SL3 are connected with each other to form one line. Accordingly, the conductive layers 11 stacked on the cell area C are patterned in the shape of interlaced fingers by the first, second and third slits SL1, SL2 and SL3. Here, the third slits SL3 may have an island shape having a plane shaped like a quadrangle, a polygon, a circle, an oval, a cross, a rhombus, and the like.

For reference, the first to seventh slits SL1 to SL7 may be simultaneously formed at the same time or at different times. For example, the second, third, fourth, fifth and sixth slits SL2, SL3, SL4, SL5 and SL6 are first formed, and then the first and seventh slits SL1 and SL7 are secondarily formed.

FIG. 2D is a layout diagram of the semiconductor device according to the embodiment of the present invention that has been described with reference to FIG. 1A. Hereinafter, contents already described in the aforementioned description will be omitted.

As illustrated in FIG. 2D, the semiconductor device according to the embodiment of the present invention includes one or more slits among the third to eighth slits SL3 to SL8. Here, the strings ST may be arranged in a matrix form.

In the aforementioned embodiment, a case in which the first slits SL1 and the second slits SL2 are separately formed has been described. However, in the present embodiment, a case in which the first slits SL1 and the second slits SL2 are integrally connected to form as one eighth slit SL8 will be described. The eighth slit SL8 may be formed in one curved line. Further, although it is not illustrated in FIG. 2D, the eighth slit SL8 may include one or more protrusions.

The third slits SL3 may have an island shape having a plane shaped like "H". Further, the third slits SL3 are positioned between the channel layers CH, and especially, may be positioned at a center of one row of strings. According to the aforementioned structure, the conductive layers 11 stacked on the cell area C are patterned in the shape of interlaced fingers by the third and eighth slits SL3 and SL8.

For reference, the third slit SL3 and the eighth slit SL8 are connected to form one line, so that a connection portion of the third slit SL3 and the eighth slit SL8 may be deformed in order to secure a process margin. For example, the connection portion may be deformed to have a T-shape by expanding a width of the connection portion of the eighth slit SL8.

Figure 3A:
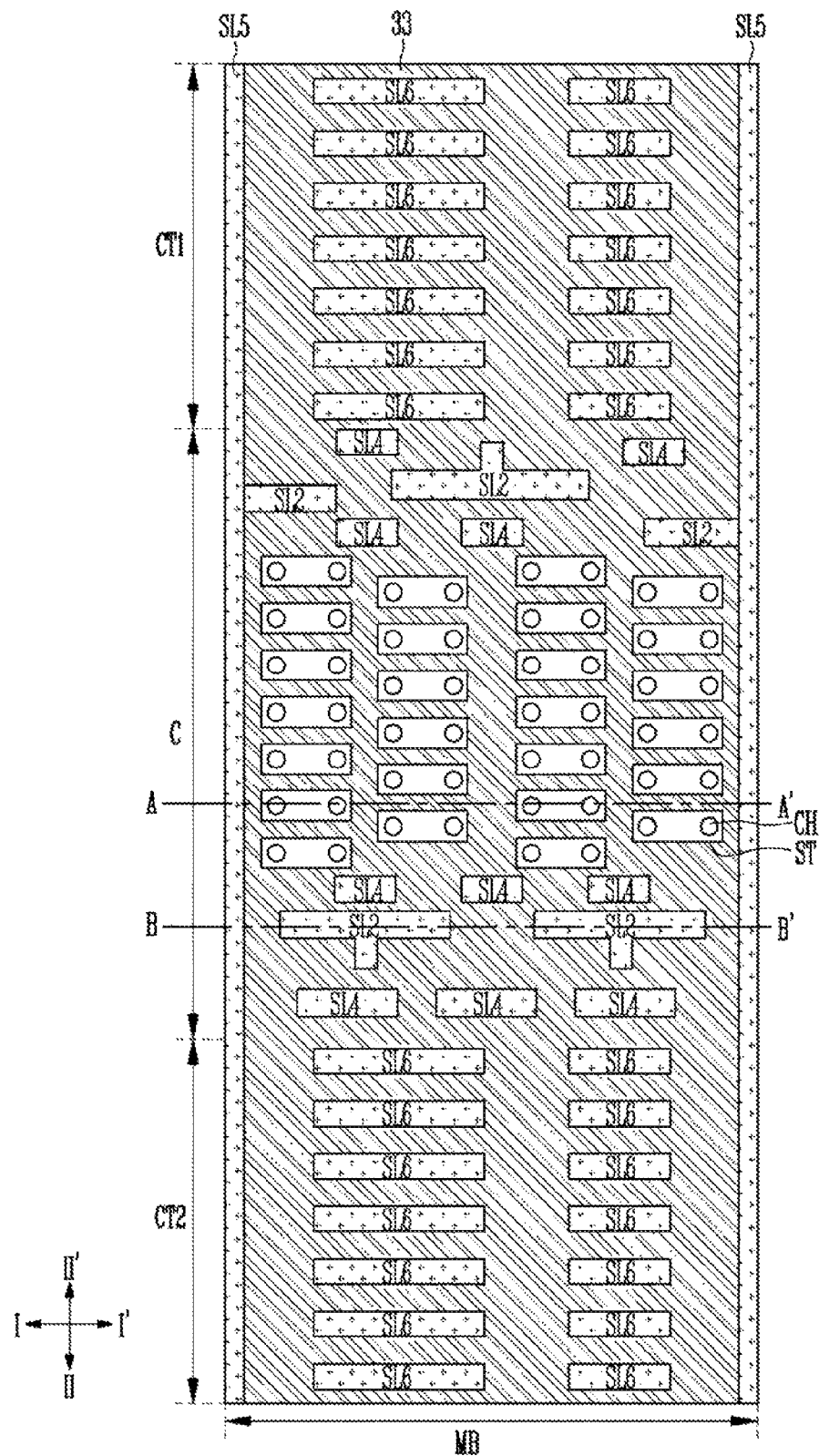
Figure 3B:
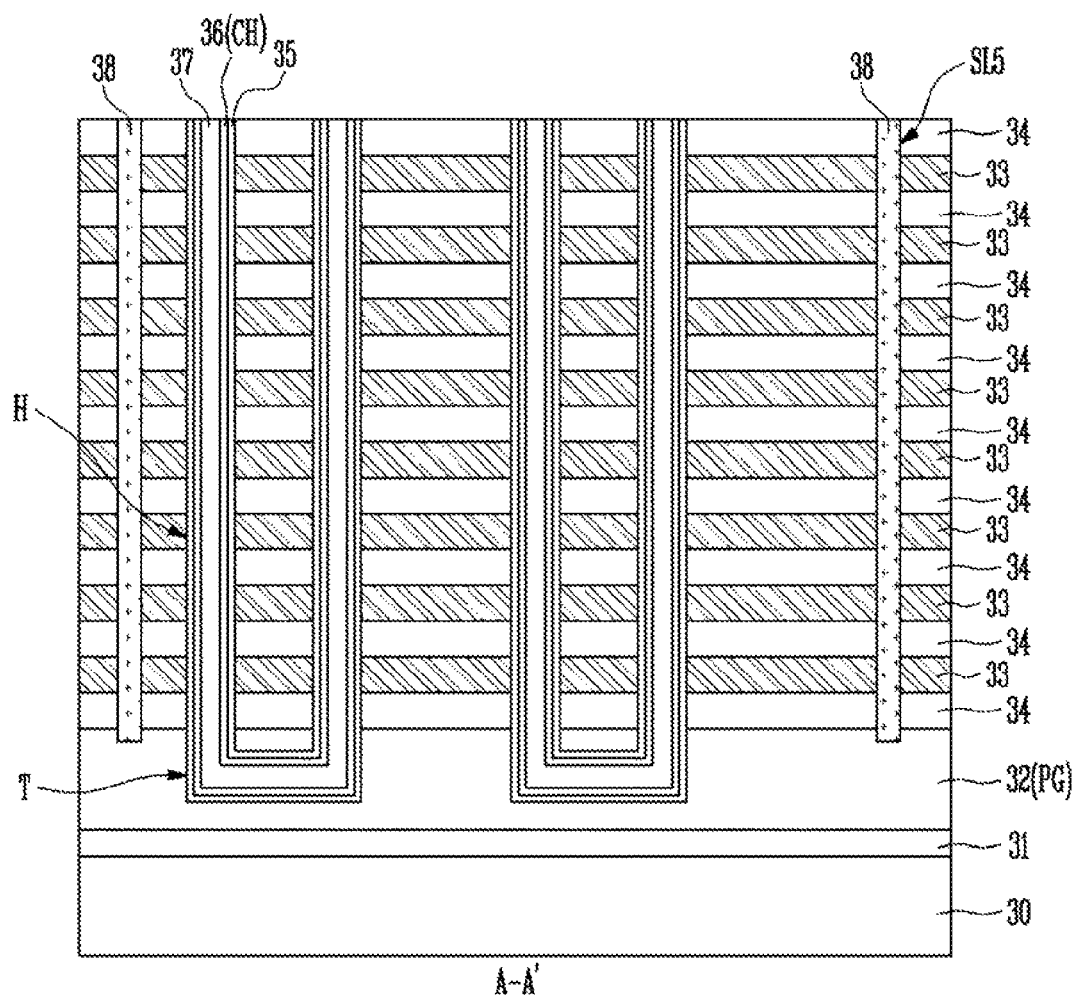
Figure 4A:
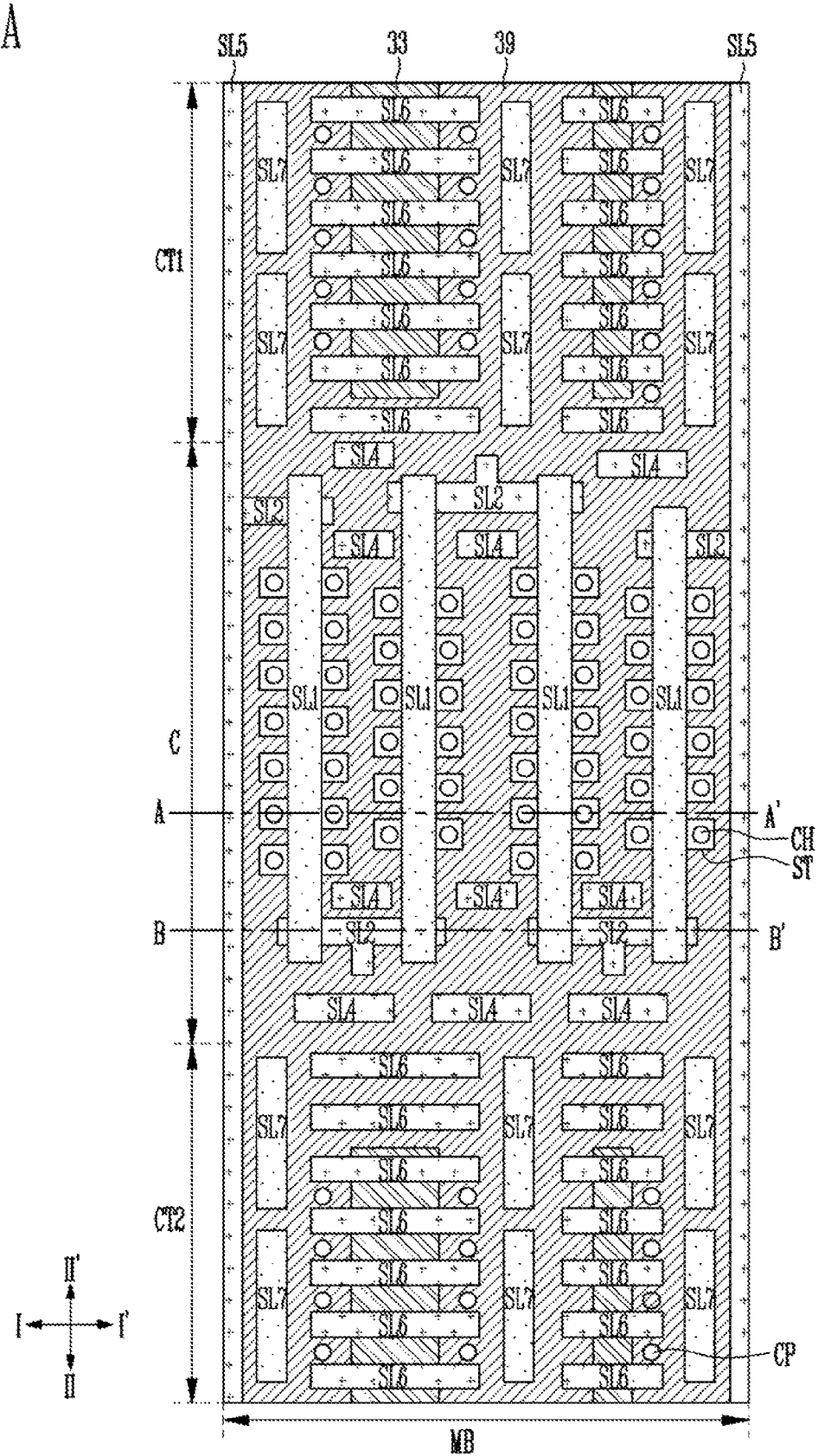
Figure 4B:
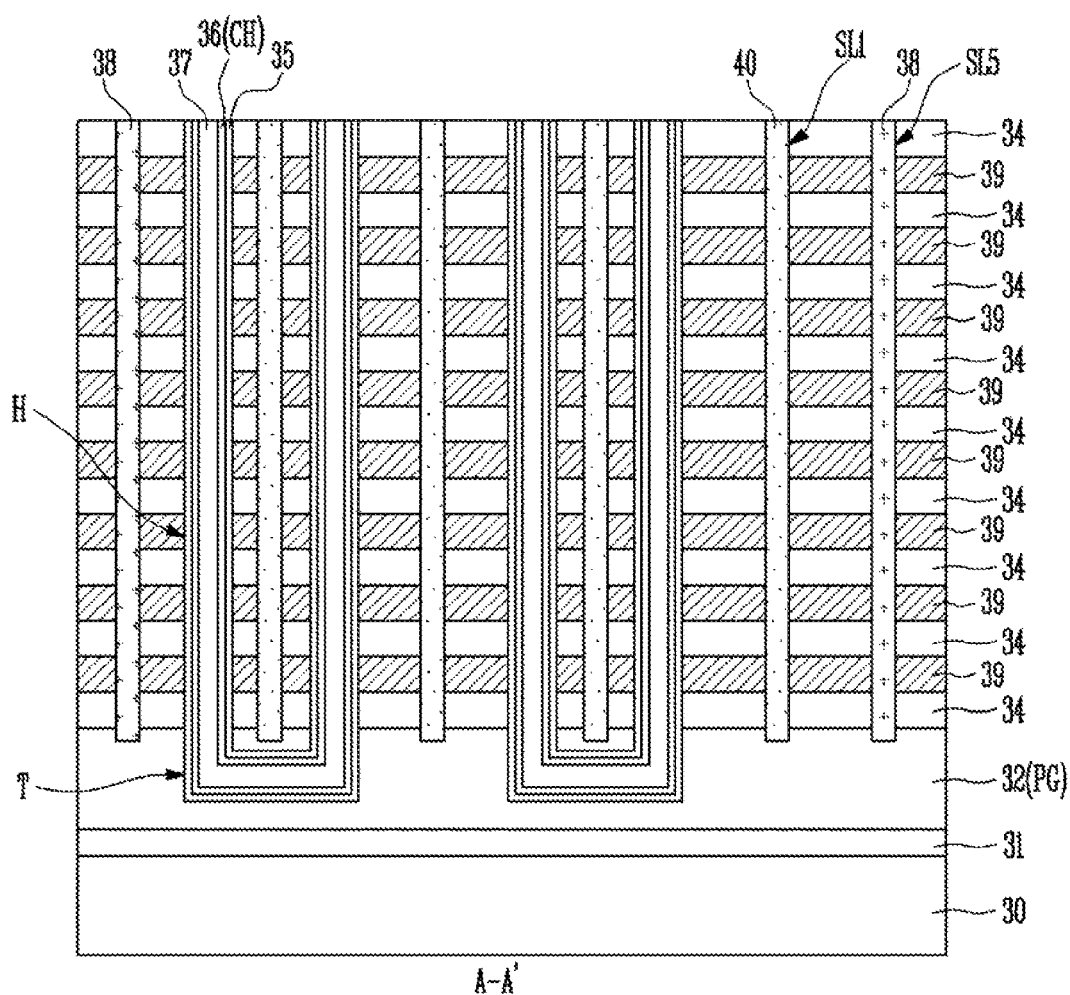
Figure 4C:
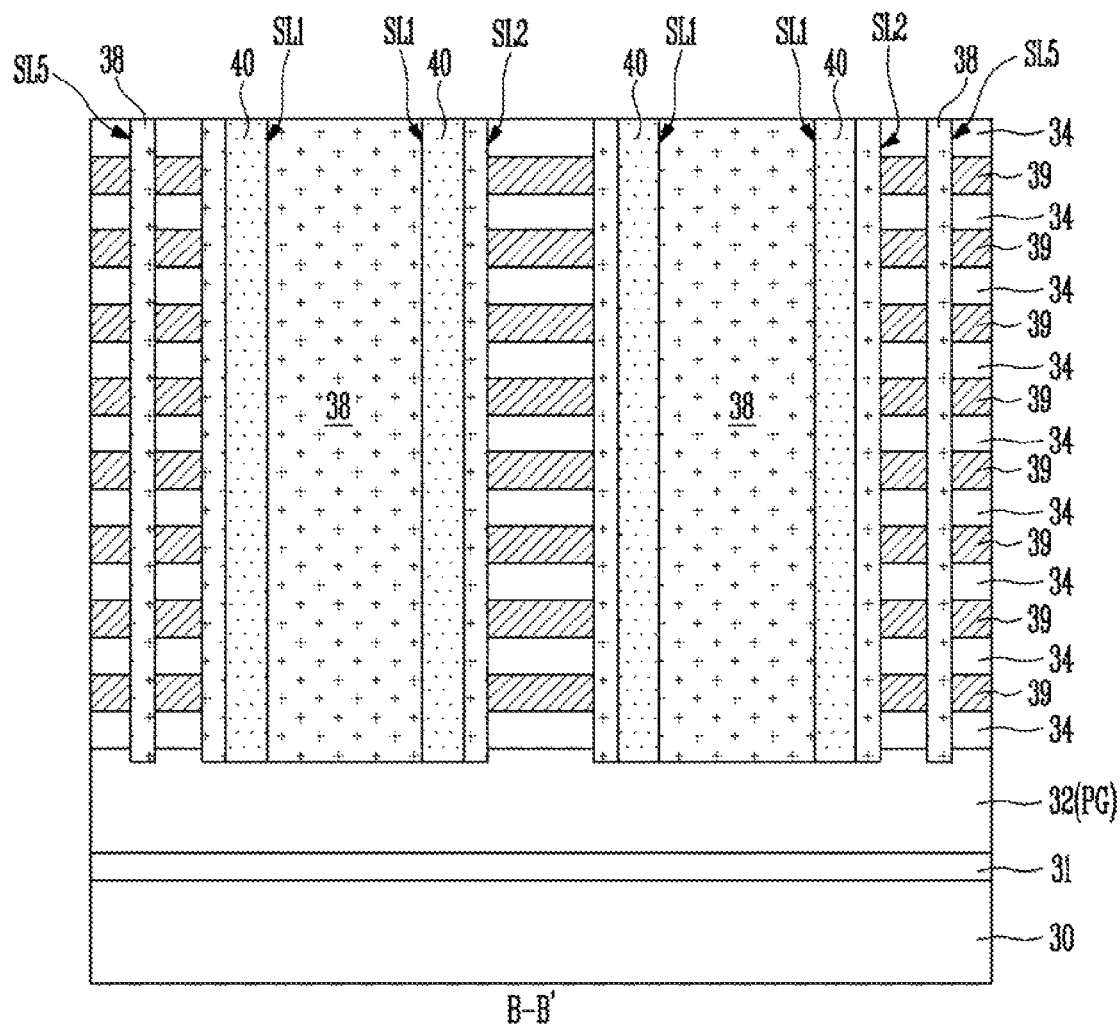

FIGS. 3A to 3C, and FIGS. 4A to 4C are views illustrating a method of manufacturing the semiconductor device described with reference to FIG. 2A. FIGS. 3A and 4A are layout diagrams of the aforementioned method. FIG. 3B is a cross-sectional view taken along the line A-A' of FIG. 3A, and FIG. 4B is a cross-sectional view taken along the line A-A' of FIG. 4A. FIG. 3C is a cross-sectional view taken along the line B-B' of FIG. 3A, and FIG. 4C is a cross-sectional view taken along the line B-B' of FIG. 4A. Hereinafter, contents already described in the aforementioned description will be omitted.

As illustrated in FIGS. 3A to 3C, an insulation layer 31 and a first conductive layer 32 are formed on a substrate 30. Here, the first conductive layer 32 is for the purpose of forming a pipe gate PG and may include a polysilicon layer.

Next, after a plurality of trenches T are formed in the first conductive layer 32, sacrificial layers (not shown) are formed in the trenches T. Next, a plurality of first material layers 33 and a plurality of second material layers 34 are alternately formed on the first conductive layer 32 on which the sacrificial layers are formed.

Here, the first material layers 33 are formed of a material having a greater etch selectivity compared to a material of the second material layers 34. For example, the first material layers 33 may be formed as conductive layers, such as doped polysilicon layers and doped amorphous silicon layers, and the second material layers 34 may be formed as sacrificial layers, such as undoped polysilicon layers and undoped amorphous silicon layers. For another example, the first material layers 33 may be formed as sacrificial layers, such as nitride layers, and the second material layers 34 may be formed as insulation layers, such as oxide layers. In the embodiment, a case in which the first material layers 33 are formed of the sacrificial layer and the second material layers are formed of the insulation layer will be described.

Next, a plurality of holes H passing through the first and second material layers 33 and 34 are formed. Here, the holes H are formed to be connected with the trenches T. For example, two or more holes H are connected to one trench T.

Subsequently, after the sacrificial layers are removed through the holes H, memory layers 35 are formed within the trenches T and the holes H. Here, each of the memory layers 35 is for storing data, and may include at least one of a charge blocking layer, a data storing layer, and a tunnel insulation layer. Further, the data storing layer may include at least one of a floating gate, such as a polysilicon layer, for storing charges, and a charge trap layer, such as a nitride layer, for trapping charges, and a nanodot for trapping charges.

Next, channel layers 36 are formed in the holes H provided with the memory layers 35. Here, the channel layers 36 may be formed so that the channel layers 36 have center regions that are open to the centers or filled to the centers, or the channel layers 36 may be formed in any combination thereof. When the channel layers 36 include the center regions that are open, insulation layers 37 are formed in the open center regions.

For reference, the gate insulation layers, the channel layers, and the memory layers may be sequentially formed in the holes H. In this case, the memory layers may be formed as phase change material layers. Here, the phase change material layers may be formed so that the phase change material layers have center regions that are open to the centers or filled to the centers, or the phase change material layers may be formed in any combination thereof. When the phase change material layers include the center regions that are open, the insulation layers are formed in the open center regions.

Next, after the second, fourth, fifth and sixth slits SL2, SL4, SL5 and SL6 passing through the first and second material layers 33 and 34 are formed, insulation layers 38 are formed therein.

Next, although it is not illustrated in the present drawing, the first and second material layers 33 and 34 of the first and second contact areas CT1 and CT2 may be patterned in a step shape. Through this, the pad portions are defined at the end portions of the respective first material layers 33.

For reference, the aforementioned process order may be changed. For example, before the holes H are formed, the first and second material layers 33 and 34 may be patterned in the step shape. Further, the holes H may be formed after the second, fourth, fifth and sixth slits SL2, SL4, SL5 and SL6 are formed.

As illustrated in FIGS. 4A to 4C, the first and seventh slits SL1 and SL7 passing through the first and second material layers 33 and 34 are formed. Here, the first and seventh slits SL1 and SL7 are formed to have a depth to expose all of the first material layers 33.

Next, recess areas are formed by removing the first material layers 33 exposed within the first and seventh slits SL1 and SL7. In this case, the insulation layers 38 formed within the second, fourth, fifth and sixth slits SL2, SL4, SL5 and SL6 serve as supporting bodies, thereby preventing the remaining second material layers 34 from being inclined or collapsed. For example, the insulation layers 38 within the second and fourth slits SL2 and SL4 serve to support the end portions of the line patterns of the second material layers 34 patterned in the finger shape. Further, the insulation layers 38 within the sixth slits SL6 serve to support the second material layers 34 within the first and second contact areas CT1 and CT2. Especially, a corner at which the first slits SL1 and the second slits SL2 cross has a cross shape, thereby effectively preventing the end portions of the remaining second material layers 34 from being inclined or collapsed.

Here, a range of a removal of the first material layers 33 may be changed according to the number, sizes, and positions of the first and seventh slits SL1 and SL7, so that the first material layers 33 may remain in a partial area. The present embodiment represents a case in which the first material layers 33 remain at partial areas of the first and second contact areas CT1 and CT2.

Next, the second conductive layers 39 are formed in the recess areas in which the first material layers 33 are removed. In this case, before the second conductive layers 39 are formed, the memory layer may be additionally formed within the recess areas. The additionally formed memory layer may include at least one of a tunnel insulation layer, a data storing layer, and a charge blocking layer.

Next, an insulation layer 40 is formed within the first and seventh slits SL1 and SL7. In this case, an air gap may be formed within the first and seventh slits SL1 and SL7 by adjusting a deposition condition of the insulation layer 40.

Next, contact plugs CP connected with the pad portions of the second conductive layers 39 are formed. Here, the contact plugs CP are distributed and disposed at the first and second contact areas CT1 and CT2.

In the meantime, the aforementioned some processes may be changed according to materials of the first and second material layers 33 and 34. For example, in a case where the first material layers 33 are formed as the conductive layers and the second material layers 34 are formed as the sacrificial layers, the first and seventh slits SL1 and SL7 are formed, and then the second material layers 34 are removed instead of the first material layers 33. In this case, the insulation layer 38 formed within the second, fourth, fifth and sixth slits SL2, SL4, SL5 and SL6 serve to support the remaining first material layers 33. Next, the insulation layer 40 is formed within the first and seventh slits SL1 and SL7 in which the second materials 34 are removed. In this case, an air gap may be formed within the first and seventh slits SL1 and SL7 in which the second materials 34 are removed by adjusting a deposition condition of the insulation layer 40.

Figure 5A:
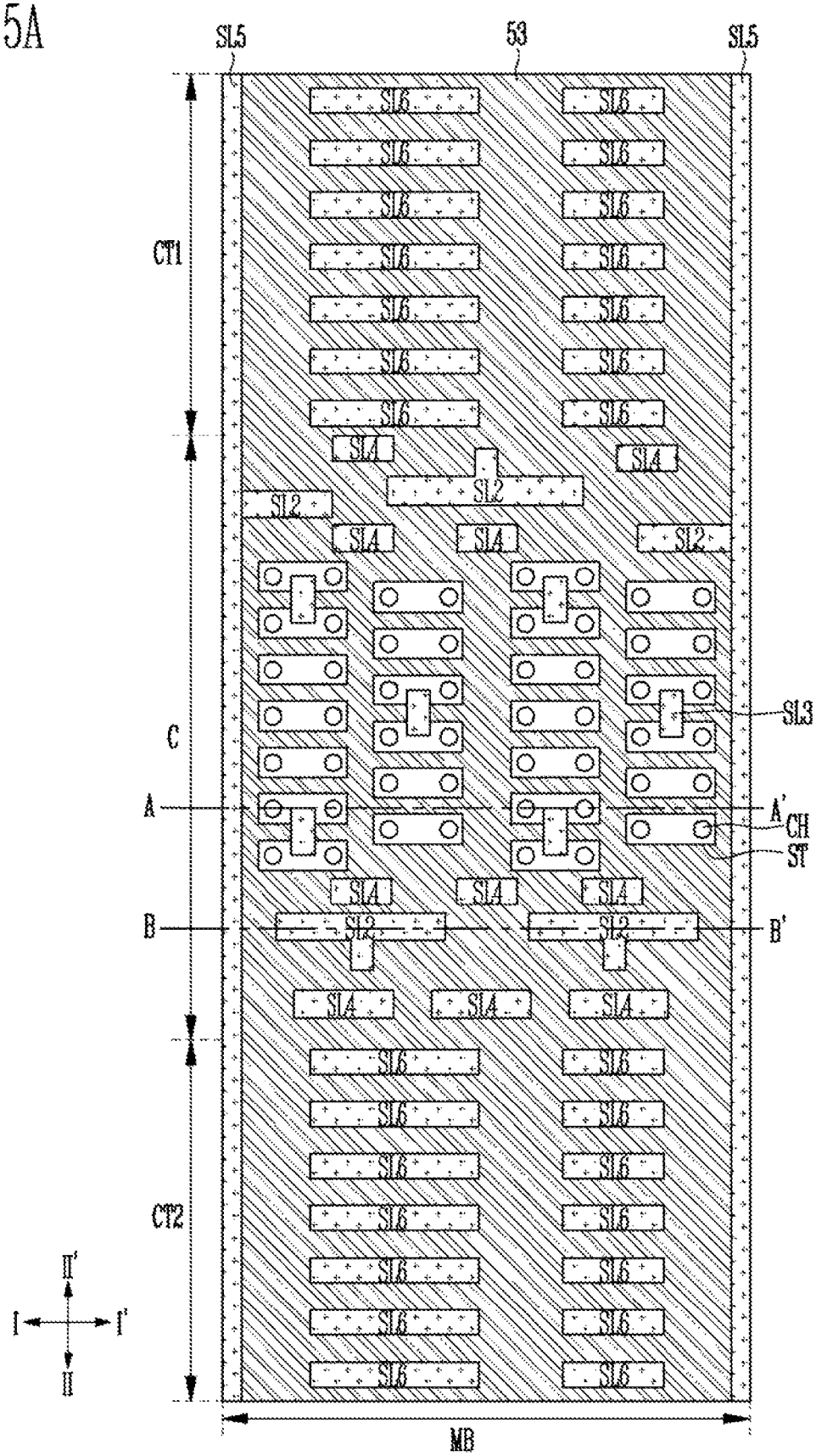
Figure 5B:
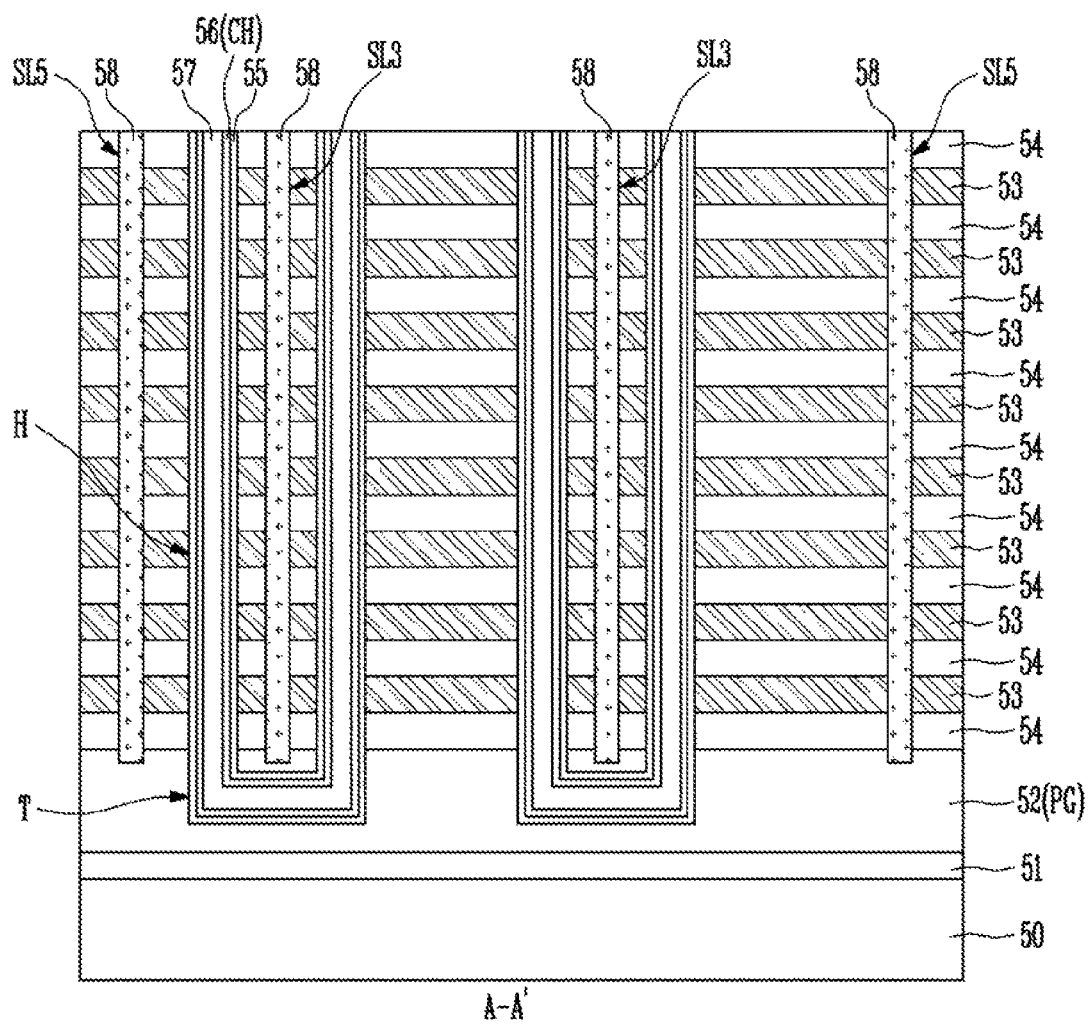
Figure 5C:
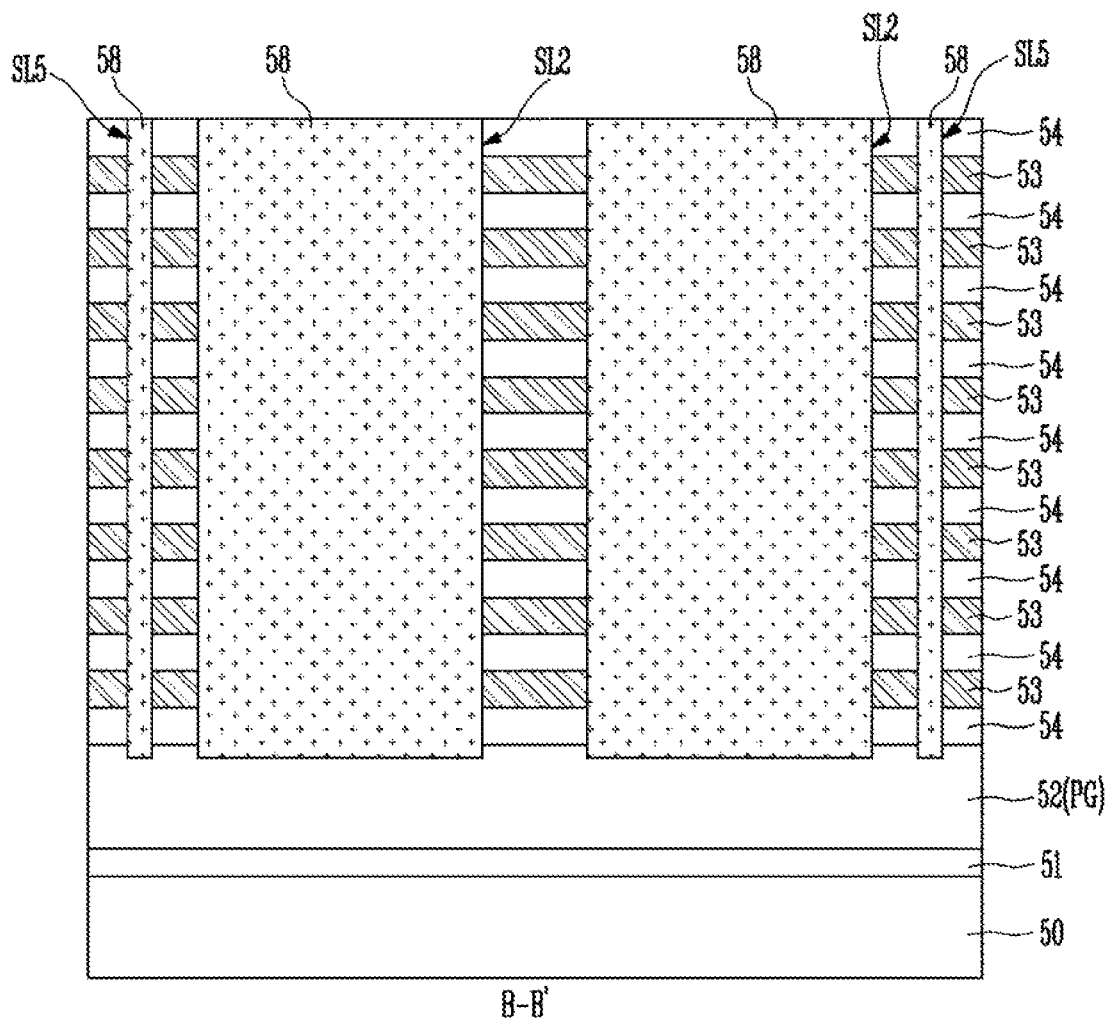
Figure 6A:
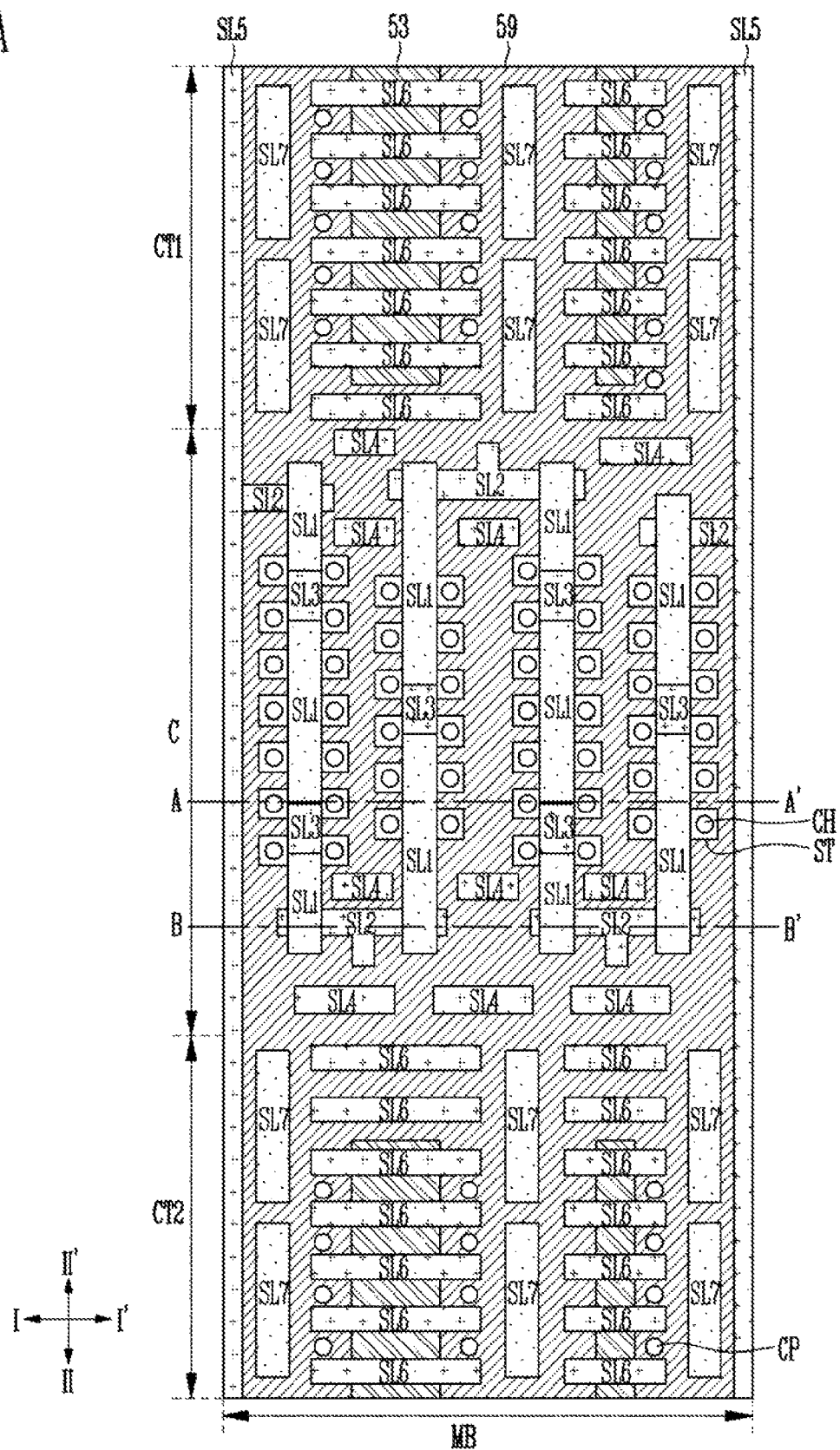
Figure 6C:
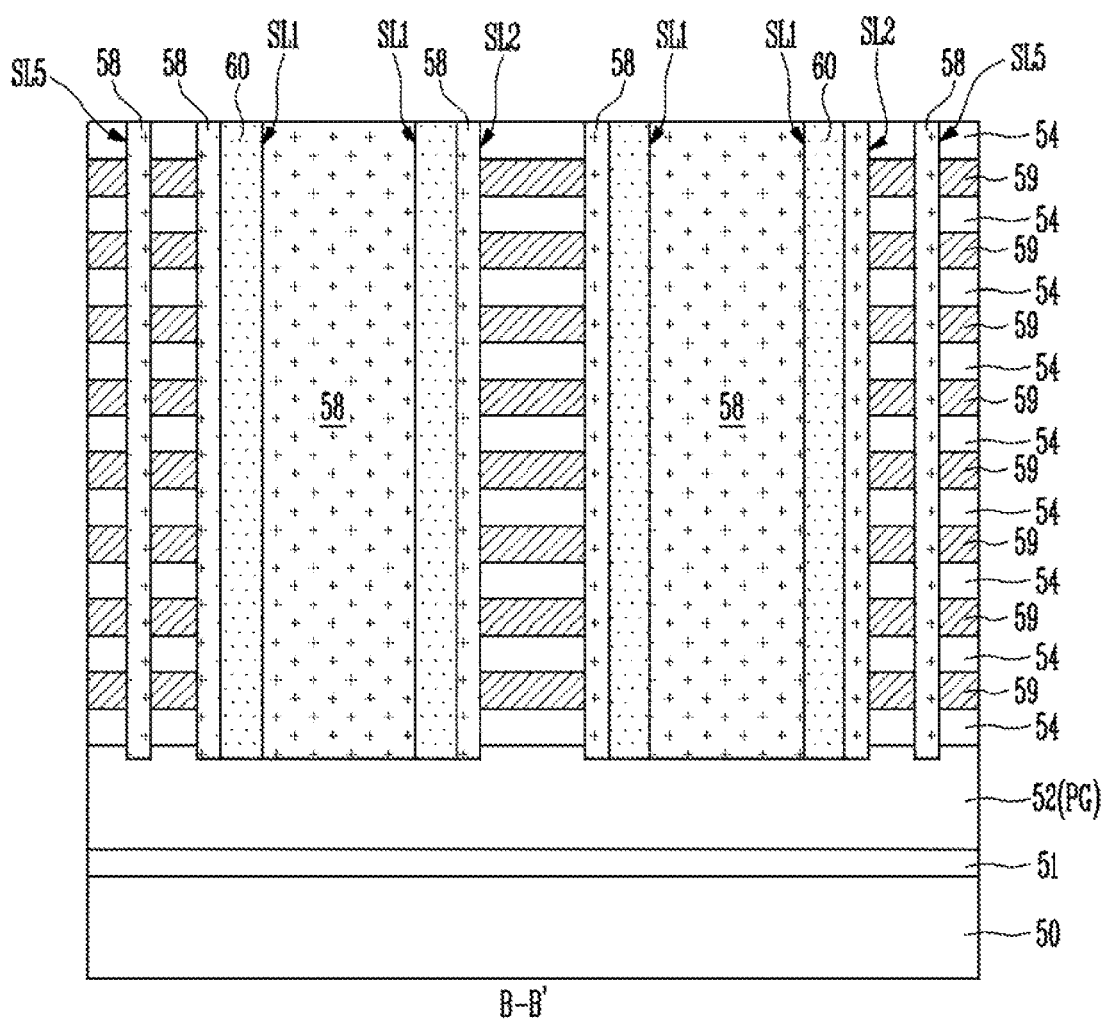

FIGS. 5A to 5C, and FIGS. 6A to 6C are views illustrating a method of manufacturing the semiconductor device described with reference to FIG. 2C. FIGS. 5A and 6A are layout diagrams of the aforementioned method. FIG. 5B is a cross-sectional view taken along the line A-A' of FIG. 5A, and FIG. 6B is a cross-sectional view taken along the line A-A' of FIG. 6A. FIG. 5C is a cross-sectional view taken along the line B-B' of FIG. 5A, and FIG. 6C is a cross-sectional view taken along the line B-B' of FIG. 6A. Hereinafter, contents already described in the aforementioned description will be omitted.

As illustrated in FIGS. 5A to 5C, a first insulation layer 51 and a first conductive layer 52 are formed on a substrate 50. Next, after a plurality of trenches T are formed in the first conductive layer 52, sacrificial layers (not shown) are formed in the trenches T. Next, a plurality of first material layers 53 and a plurality of second material layers 54 are alternately formed on the first conductive layer 52 on which the sacrificial layers are formed.

Next, a plurality of holes H passing through the first and second material layers 53 and 54 are formed. Subsequently, after the sacrificial layers are removed through the holes H, memory layers 55 and channel layers 56 are formed within the trenches T and the holes H. Insulation layers 57 are formed in the open center regions of the channel layers 56.

Next, after the second, third, fourth, fifth and sixth slits SL2, SL3, SL4, SL5 and SL6 passing through the first and second material layers 53 and 54 are formed, insulation layers 58 are formed therein.

As illustrated in FIGS. 6A to 6C, the first and seventh slits SL1 and SL7 passing through the first and second material layers 53 and 54 are formed, and then recess areas are formed by removing the first material layers 53 exposed within the first and seventh slits SL1 and SL7. In this case, the insulation layers 58 formed within the second, and third to sixth slits SL2, and SL3 to SL6 serve as supporting bodies, thereby preventing the remaining second material layers 54 from being inclined or collapsed. Especially, the insulation layers 58 within the third slits SL3 serve to support line patterns of the second material layers 54 patterned in the finger shape.

Next, second conductive layers 59 are formed at the recess areas in which the first material layers 53 are removed, and then an insulation layer 60 is formed within the first and seventh slits SL1 and SL7.

Figure 7B:
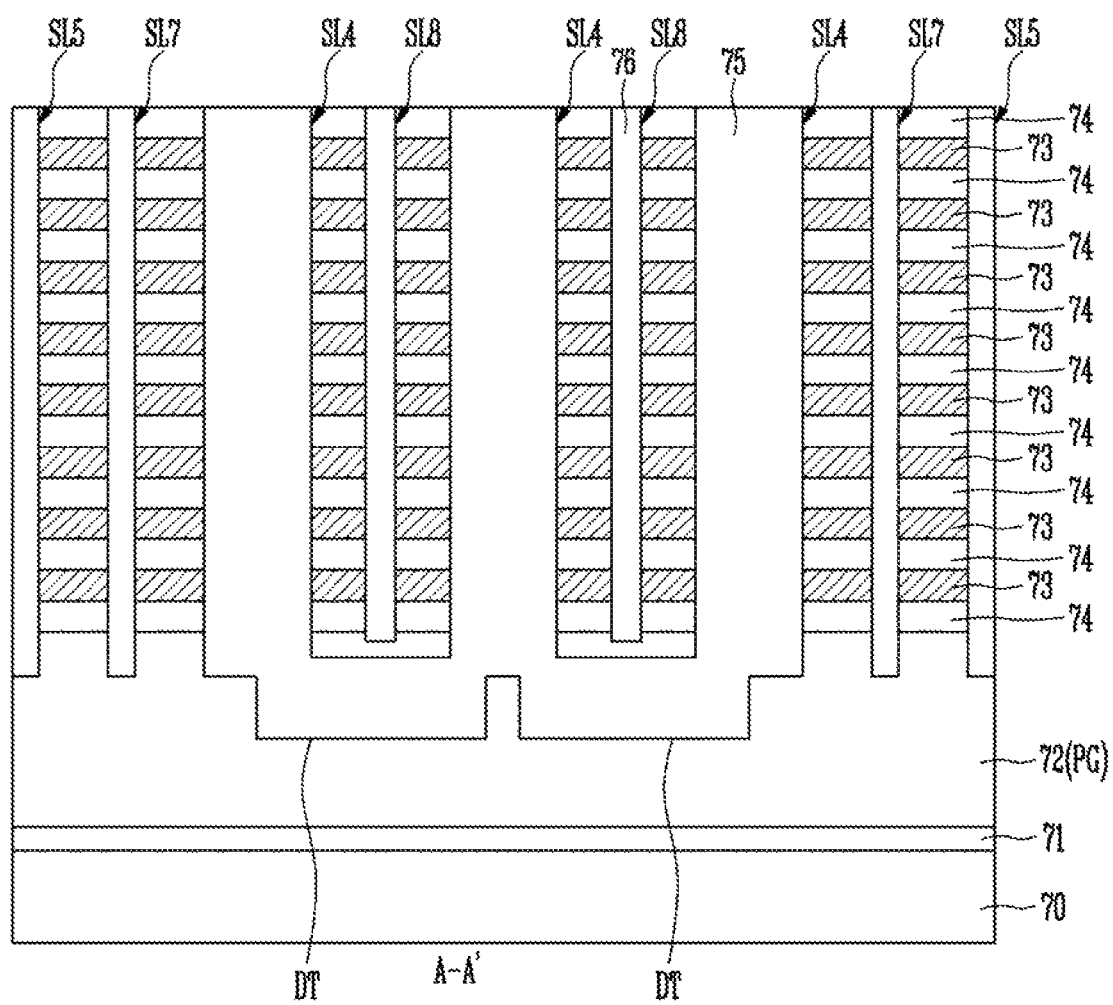

FIG. 7A is a layout diagram of a semiconductor device according to an embodiment of the present invention. FIG. 7B is a cross-sectional view taken along the line A-A' of FIG. 7A. Hereinafter, contents already described in the aforementioned description will be omitted.

As illustrated in FIGS. 7A and 7B, a semiconductor device according to an embodiment of the present invention includes an insulation layer 71, a first conductive layer 72, and a plurality of second conductive patterns 73 sequentially stacked on the substrate 70. For example, the first conductive layer 72 may be a pipe gate PG, at least one uppermost second conductive pattern 73 among the second conductive patterns 73 may be selection lines, and the remaining second conductive patterns 73 may be word lines. For another example, the first conductive layer 72 may be a lower selection line, at least one uppermost second conductive pattern 73 among the second conductive patterns 73 may be upper selection lines, and the remaining second conductive patterns 73 may be word lines.

Here, insulation layers 74 are interposed between the stacked second conductive patterns 73. Further, instead of the second conductive patterns 73, sacrificial layers 77 may be positioned at portions of the contact areas CT1 and CT2.

The semiconductor device further includes the fourth slits SL4 and at least one eighth slits SL8 passing through the second conductive patterns 73. Here, the fourth slits SL4 are positioned at the edges of the cell area C or at a boundary between the cell area C and the contact areas CT1 and CT2. Especially, the fourth slits SL4 may be positioned with the eighth slit SL8 interposed therebetween. Further, the eighth slit SL8 isolates the finger-shaped second conductive patterns 73 from each other. For example, the eighth slit SL8 has a curved line shape, and the second conductive patterns 73 have the interlaced finger configuration. Here, insulation layers 76 may be formed in the eighth slits SL8 or an air gap may be formed in the eighth slits SL8.

The semiconductor device further includes a plurality of dummy trenches DT formed in the first conductive layer 72. The dummy trenches DT cross the eighth slit SL8, and are positioned so that at least a part of the dummy trenches DT overlap end portions of the second conductive patterns 73. For example, the dummy trenches DT overlap end portions of line patterns included in the second conductive patterns 73. In this case, one dummy trench DT is positioned extending over a source side word line and a drain side word line. Further, the dummy trenches DT may be simultaneously formed when the trenches T are formed by etching the first conductive layer 72.

In this case, when the sacrificial layers are formed within the trenches T, the sacrificial layers may be formed even within the dummy trenches DT.

Here, the dummy trenches DT are connected with the fourth slits SL4. For example, each of the dummy trenches DT is connected with at least two fourth slits SL4, and each fourth slit SL4 is connected with at least two dummy trenches DT. In this case, the dummy trenches DT and the fourth slits SL4 are substantially extended in the same direction and are connected with each other to have "W"-shaped cross sections. For example, the fourth slit SL4 passing through the source side word line and the fourth slit SL4 passing through the drain side word line are connected to one dummy trench DT.

Further, insulation layers 75 may be formed within the dummy trenches DT and the fourth slits SL4. The present drawing represents a case where the insulation layers 75 are integrally connected within the dummy trenches DT and the fourth slits SL4, and each of the dummy trenches DT and the fourth slits SL4 may be filled with a material. For example, previously formed sacrificial layers may remain within the dummy trenches DT, and the insulation layers 75 may be formed within the fourth slits SL4. Here, insulation layers 75 formed within the dummy trenches DT and the fourth slits SL4 are used as supporting bodies. As described above, it may be possible to form the supporting bodies having a solid structure by forming the W-shaped supporting bodies.

The semiconductor device may further include the fifth to seventh slits SL5 to SL7. Here, the fifth slits SL5 are positioned between the adjacent memory blocks MB, and include one or more protrusions protruding toward the inside of the memory block MB, for example, toward the insides of the contact areas CT1 and CT2. The sixth and seventh slits SL6 and SL7 are positioned within the contact areas CT1 and CT2, and may be extended in a direction in which the sixth and seventh slits SL6 and SL7 cross each other. For example, the sixth slits SL6 may have be extended in the first direction I-I', and the seventh slits SL7 may be extended in the second direction II-II'. In this case, the seventh slits SL7 are extended to the cell area C to be connected with the eighth slits SL8. For reference, each of the sixth and seventh slits SL6 and SL7 may include one or more protrusions.

The insulation layers 75 may be formed within the fifth and sixth slits SL5 and SL6, and may be used as the supporting bodies. Further, insulation layers 76 may be formed in the seventh slits SL7 or an air gap may be formed in the seventh slits SL7.

Figure 8A:
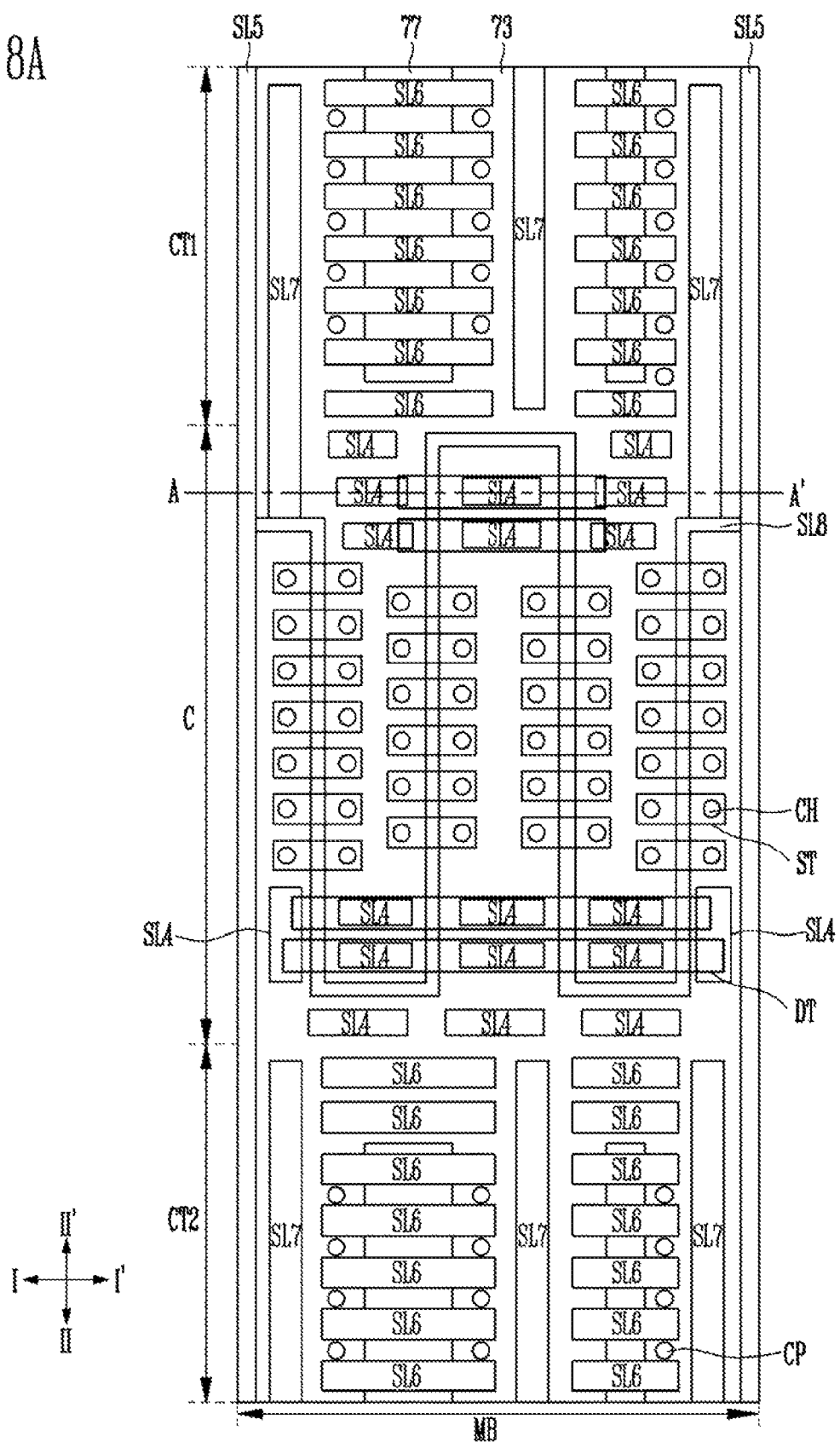

FIG. 8A is a layout diagram of a semiconductor device according to an embodiment of the present invention. FIG. 8B is a cross-sectional view taken along the line A-A' of FIG. 8A. Hereinafter, contents already described in the aforementioned description will be omitted.

As illustrated in FIGS. 8A and 8B, a semiconductor device according to an embodiment of the present invention includes a plurality of dummy trenches DT and the fourth slits SL4. Here, each of the dummy trenches DT is connected with at least three fourth slits SL4. Further, the fourth slits SL4 have forms extended in the first direction I-I' or the second direction II-II'. For example, the fourth slits SL4 positioned at the center of the memory block MB have the forms extended in the first direction I-I', and the fourth slits SL4 positioned at the edges of the memory block MB have the forms extended in the second direction II-II'. In this case, the dummy trenches DT are connected to the fourth slits SL4 at the edges of the memory block MB, thereby forming the more solid supporting bodies.

Other structures are substantially the same as those of the semiconductor device previously described with reference to FIGS. 7A and 7B.

Figure 9A:
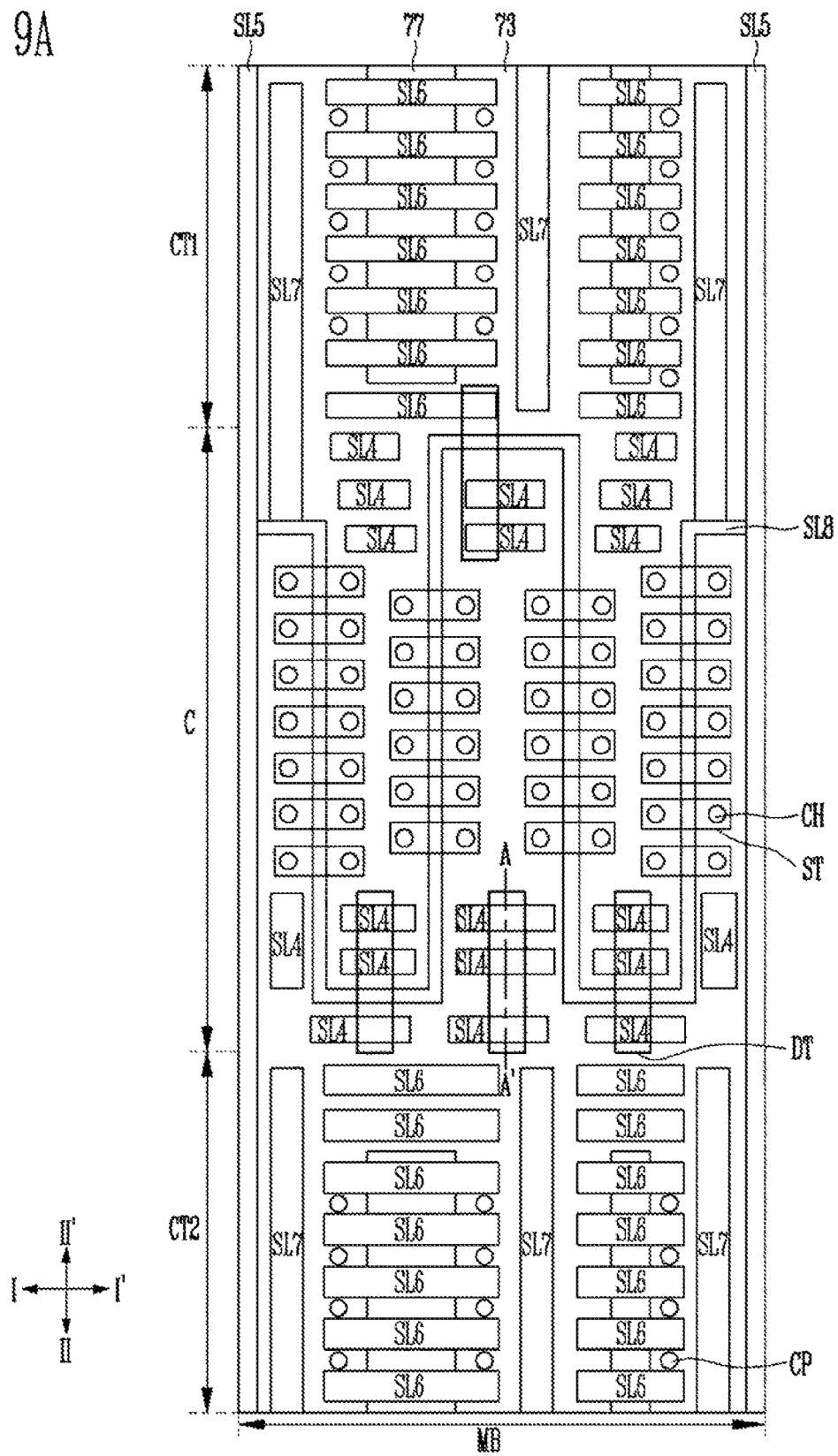

FIG. 9A is a layout diagram of a semiconductor device according to an embodiment of the present invention. FIG. 9B is a cross-sectional view taken along the line A-A' of FIG. 9A. Hereinafter, contents already described in the aforementioned description will be omitted.

As illustrated in FIGS. 9A and 9B, a semiconductor device according to an embodiment of the present invention includes a plurality of dummy trenches DT and the fourth slits SL4. Here, the dummy trenches DT and the fourth slits SL4 are extended in the direction in which the dummy trenches DT and the fourth slits SL4 cross each other. For example, the dummy trenches DT are extended in the second direction II-II', and the fourth slits SL4 are extended in the first direction I-I'. Further, the dummy trenches DT may be extended up to the contact area CT1 to cross at least one sixth slit SL6.

Other structures are substantially the same as those of the semiconductor device previously described with reference to FIGS. 7A and 7B.

Figure 10:
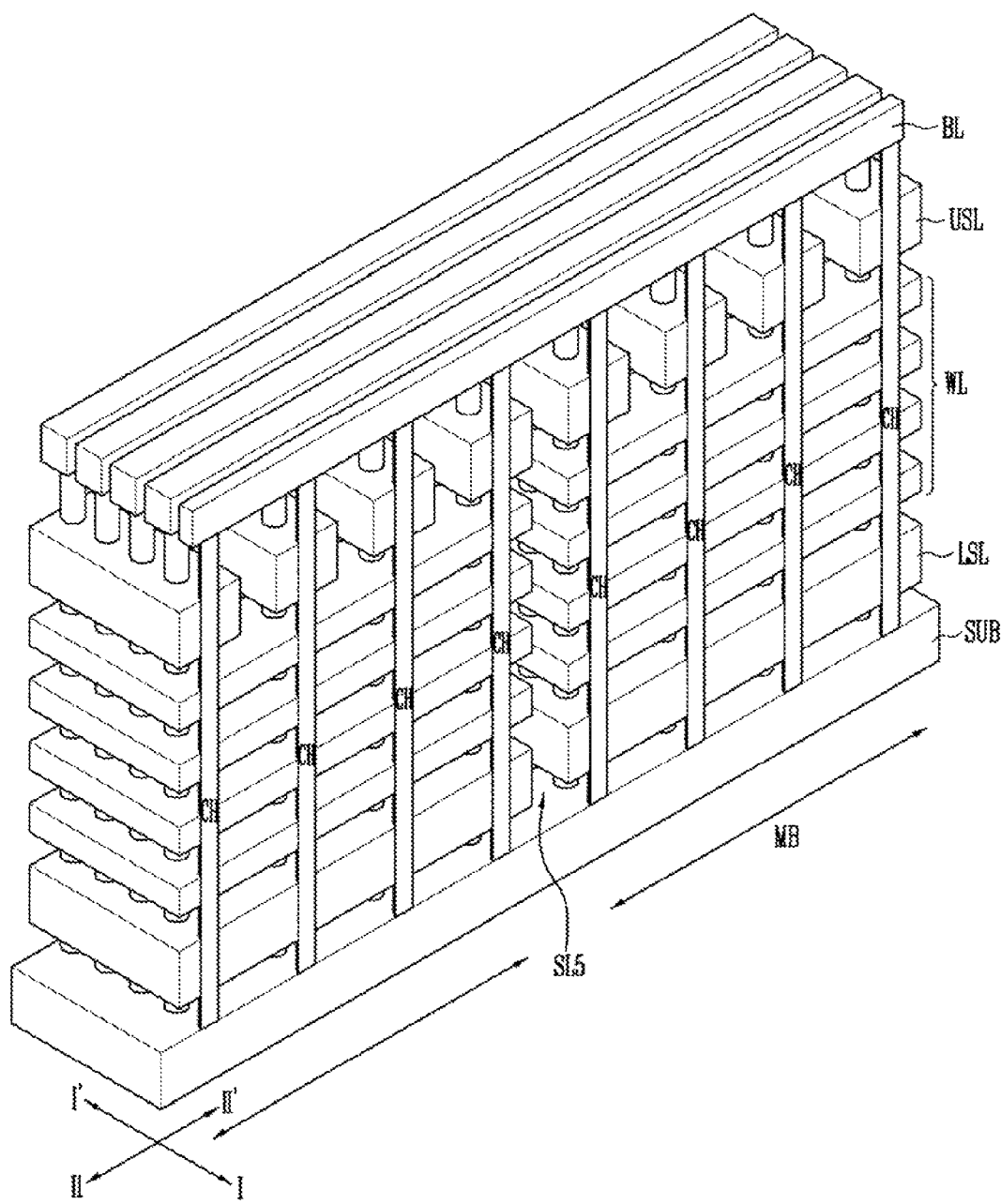
FIGS. 10 to 12 are perspective views of semiconductor devices according to an embodiment of the present invention.
Figure 11:
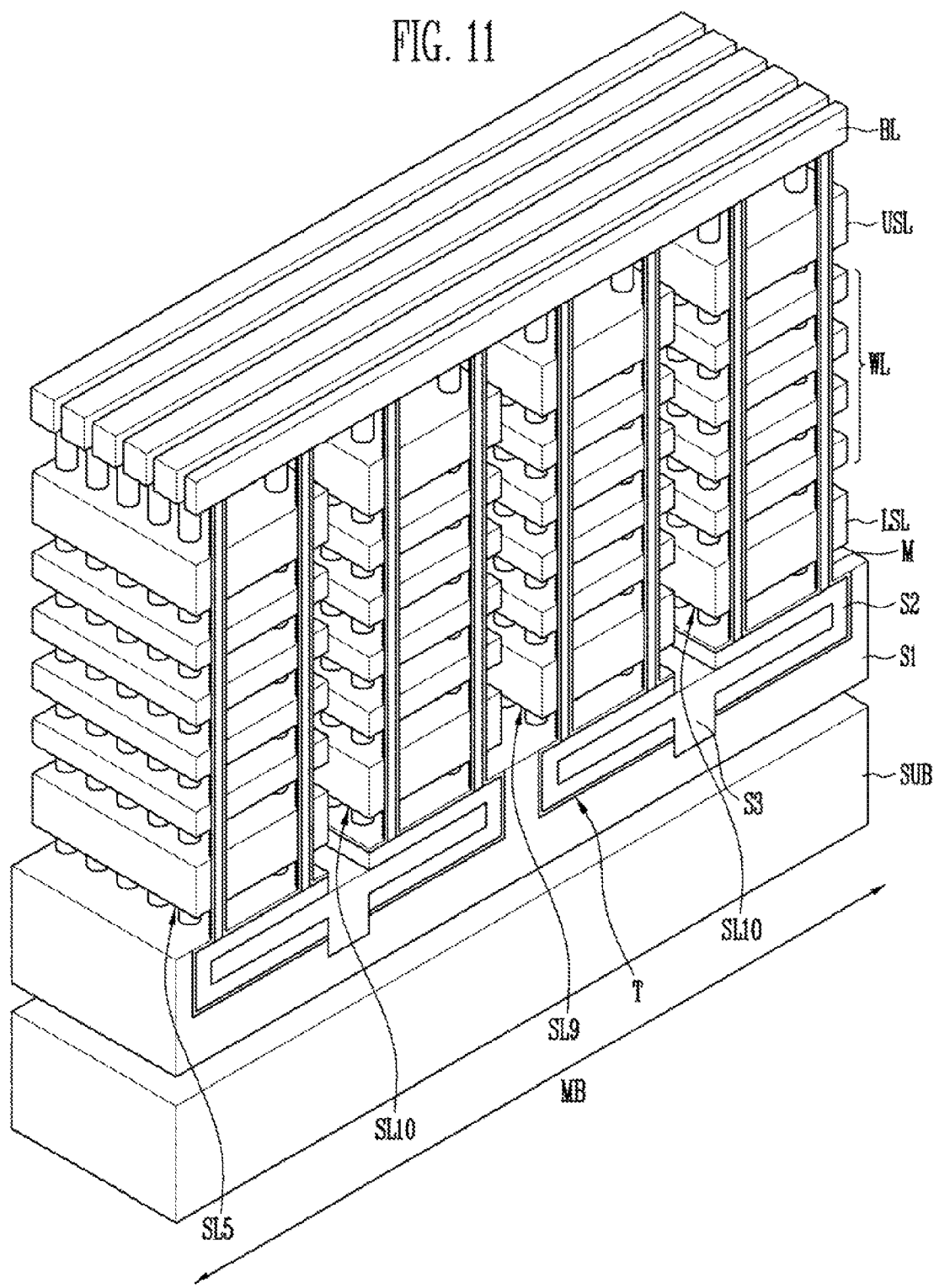
Figure 12:
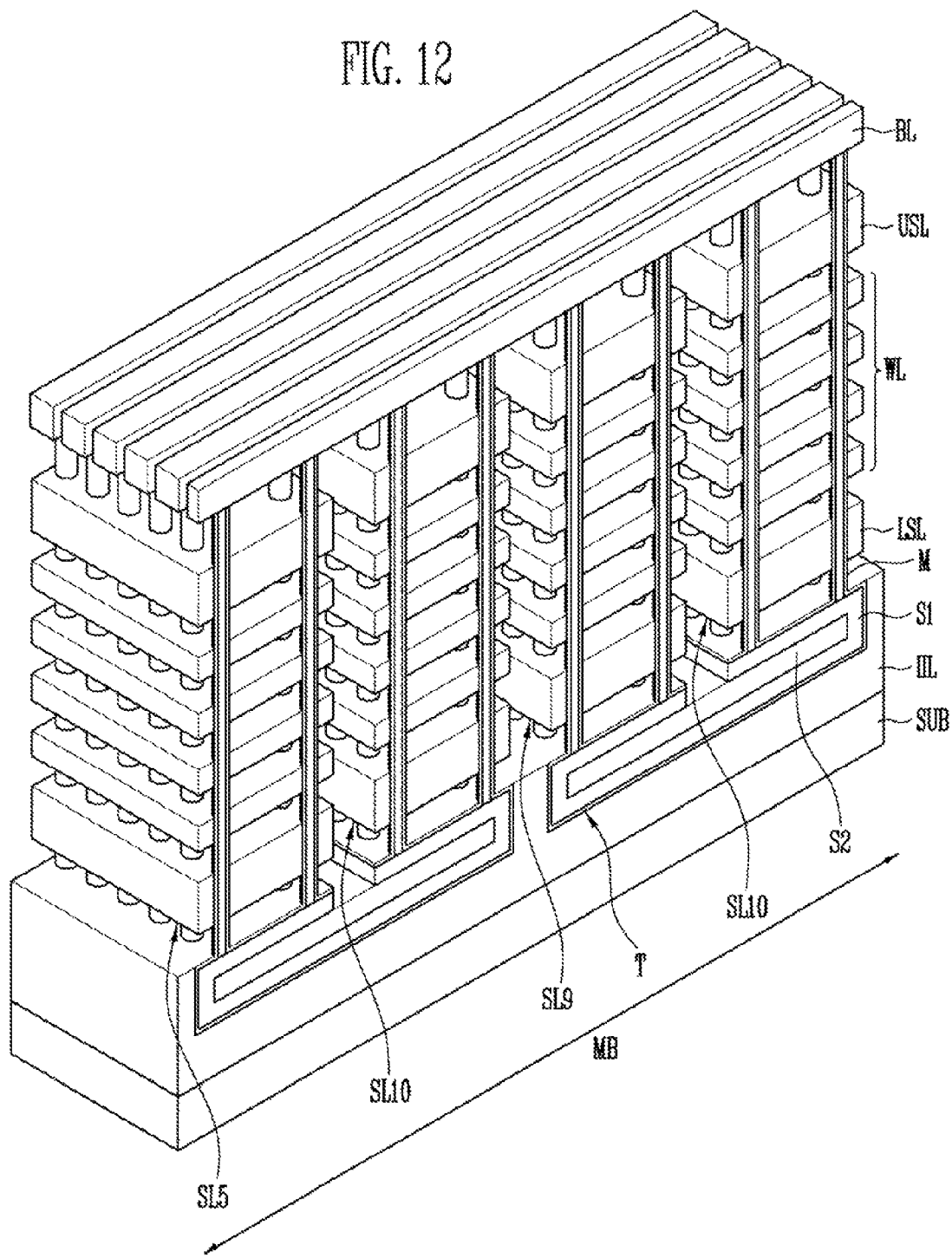

FIGS. 10 to 12 are perspective views of semiconductor devices according to an embodiment of the present invention. These figures illustrate a cell area. Hereinafter, contents already described in the aforementioned description will be omitted.

As illustrated in FIG. 10, a semiconductor device according to an embodiment of the present invention includes one or more lower selection lines LSL, a plurality of word lines WL, and one or more upper selection lines USL, which are sequentially stacked on a substrate SUB.

The semiconductor device further includes channel layers CH protruding from the substrate SUB. The channel layers may be arranged in a matrix form at a predetermined interval, or may be arranged in a form in which centers of the channel layers are offset, or may be arranged in a form of a combination thereof.

The semiconductor device may further include one or more lower selection lines LSL, a plurality of word lines WL, and one or more upper selection lines USL, which are stacked while surrounding the channel layers CH. For example, the upper selection lines USL are formed to surround one pillar row, and the word lines WL and the lower selection lines LSL are formed to surround at least one pillar row.

The semiconductor device further includes bit lines BL connected to upper ends of the channel layers CH and a source layer (not shown) connected to the lower ends of the channel layers CH. Further, the semiconductor device may further include at least one of a first memory layer (not illustrated) interposed between the channel layer CH and the word lines WL while surrounding the channel layer CH, and a second memory layer (not illustrated) interposed between the word lines WL and the first memory layer (not illustrated) while surrounding the word line WL.

Further, the semiconductor device may further include the fifth slits SL5 positioned between the adjacent memory blocks MB. As described above, the fifth slits SL5 may include one or more protrusions. For example, the protrusions are positioned at the contact area and are asymmetrically or symmetrically arranged at both sides of the fifth slits SL5.

For reference, although it is not illustrated in the drawing, the semiconductor device may further include at least one of the first, second, third, fourth, sixth and seventh slits SL1, SL2, SL3, SL4, SL6 and SL7.

According to the aforementioned structure, the lower selection transistors are formed at a position at which the channel layers CH and the lower selection lines LSL cross, the memory cells are formed at a position at which the channel layers CH and the word lines WL cross, and the upper selection transistors are formed at the position at which the channel layers CH and the upper selection lines USL cross. Accordingly, one or more of the lower selection transistors, the memory cells, and one or more of the upper selection transistor, which are serially connected, configure one string, and the strings are vertically arranged.

As illustrated in FIG. 11, a semiconductor device according to an embodiment of the present invention includes source layers S1 to S3, one or more lower selection lines LSL, a plurality of word lines WL, and one or more upper selection lines USL, which are sequentially stacked.

Here, the source layers S1 to S3 includes a first source layer S1 formed on a substrate SUB, a third source layer S3 formed within the first source layer S1, and a second source layer S2 interposed between the first source layer S1 and the third source layer S3 while surrounding the third source layer S3. Further, the third source layer S3 is connected with the first source layer S1 while passing through the second source layer S2. Here, the first and second source layers S1 and S2 may include polysilicon layers, and the third source layer S3 may include a metal layer, such as tungsten (W).

The semiconductor device may further include a plurality of channel layers CH protruding from an upper surface of the second source layer S2. One or more of the lower selection lines LSL, the plurality of word lines WL, and one or more of the upper selection lines USL are sequentially stacked while surrounding the channel layers CH. Here, the channel layers CH may be integrally connected with the second source layer S2. Further, upper ends of the channel layers CH may be connected with bit lines BL.

The semiconductor device further includes memory layers M interposed between the channel layers CH and the word lines WL. Here, the memory layers M are formed in a shape surrounding the channel layers CH and an outer surface of the second source layer S2.

Further, the semiconductor device further includes fifth, ninth, and tenth slits SL5, SL9, and SL10. The ninth slits SL9 are positioned between the adjacent channel layers CH, and have a depth to pass through the lower selection lines LSL, the word lines WL, and the upper selection lines USL. The tenth slits SL10 are positioned between the adjacent channel layers CH, and have a depth to pass through trenches T, the lower selection lines LSL, the word lines WL, and the upper selection lines USL. Further, the fifth slits SL5 are positioned between the adjacent memory blocks MB, and have a depth to pass through the first source layer S1, the lower selection lines LSL, the word lines WL, and the upper selection lines USL. As described above, the fifth slits SL5 may include one or more protrusions. For example, the protrusions are positioned at the contact area, and are asymmetrically or symmetrically arranged at both sides of the fifth slits SL5.

For reference, although it is not illustrated in the drawing, the semiconductor device may further include at least one of the first, second, third, fourth, sixth, and seventh slits SL1, SL2, SL3, SL4, SL6 and SL7.

According to the aforementioned structure, one or more of the lower selection transistors, the memory cells, and one or more of the upper selection transistor, which are serially connected, configure one string, and the strings are vertically arranged.

As illustrated in FIG. 12, a semiconductor device according to an embodiment of the present invention includes an interlayer insulation layer IIL, one or more lower selection lines LSL, a plurality of word lines WL, and one or more upper selection lines USL, which are sequentially stacked.

The semiconductor device further includes a first source layer S1 formed within the interlayer insulation layer IIL and a second source layer S2 formed within the first source layer S1.

The present embodiment is characterized by forming the first and second source layers S1 and S2 within the interlayer insulation layer IIL, and other structures are substantially the same as those previously described with reference to FIG. 11. Further, in the present drawing, it is illustrated that the first source layer S1 completely surrounds the lower surface of the second source layer S2, but a lower surface of the second source layer S2 may partially protrude to pass through the first source layer S1.

Figure 13:
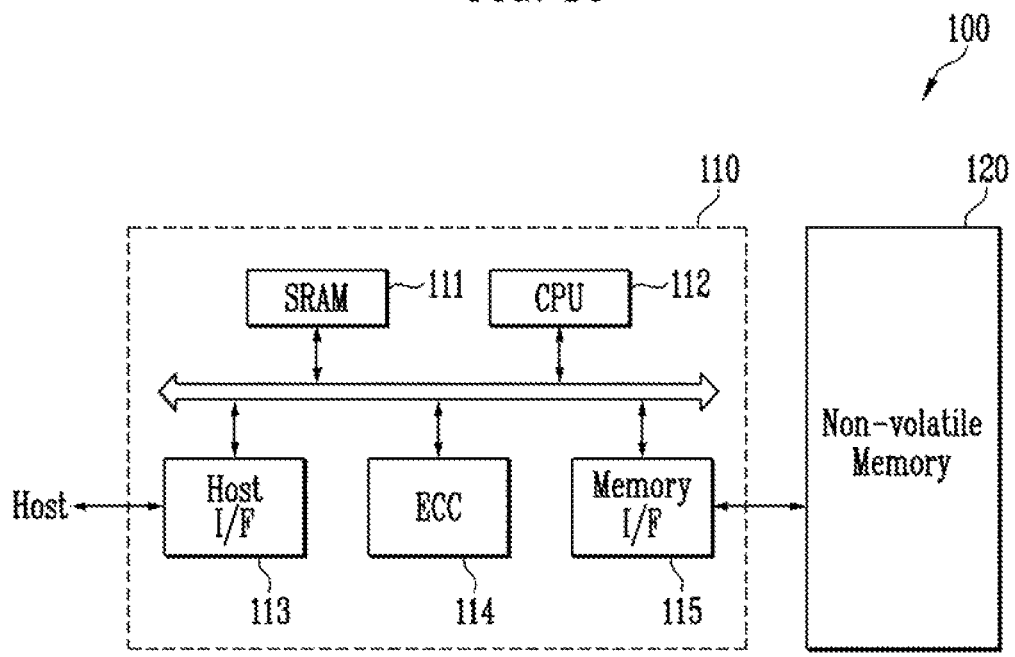
FIG. 13 is a diagram illustrating a configuration of a memory system according to an exemplary embodiment of the present invention.

FIG. 13 is a diagram illustrating a configuration of a memory system according to an exemplary embodiment of the present invention.

As illustrated in FIG. 13, the memory system 100 according to the embodiment of the present invention includes a non-volatile memory device 120 and a memory controller 110.

The non-volatile memory device 120 has a structure according to the aforementioned layout. Further, the non-volatile memory device 120 may be a multi-chip package formed of a plurality of flash memory chips.

The memory controller 110 may be suitable for controlling the non-volatile memory device 120, and may include an SRAM 111, a CPU 112, a host interface 113, an ECC 114, and a memory interface 115. The SRAM 111 is used as an operational memory of the CPU 112, the CPU 112 performs a general control operation for a data exchange of the memory controller 110, and the host interface 113 includes a data exchange protocol of a host connected with the memory system 100. Further, the ECC 114 detects and corrects an error included in data read from the non-volatile memory device 120, and the memory interface 115 performs interfacing with the non-volatile memory device 120. In addition, the memory controller 110 may further include an ROM for storing code data for the interfacing with the host, and the like.

The memory system including the aforementioned structure may be a memory card or a Solid State Disk (SSD) in which the non-volatile memory device 120 is combined with the memory controller 110. For example, when the memory system 100 is the SSD, the memory controller 110 may communicate with an external device (for example, a host) through one of various interface protocols, such as USB, MMC, PCI-E, SATA, PATA, SCSI, ESDI, and IDE.

Figure 14:
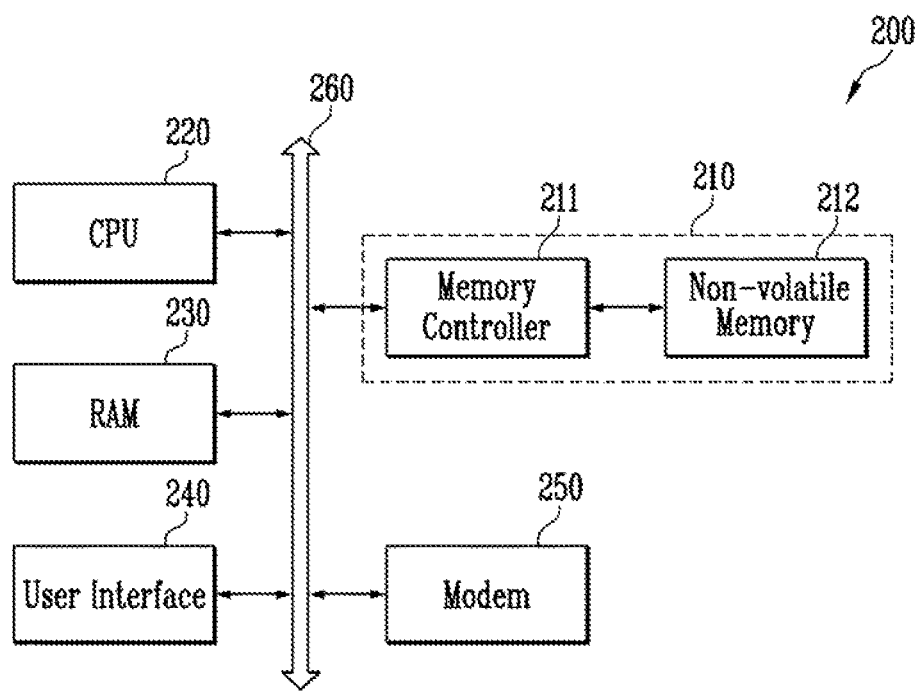
FIG. 14 is a diagram illustrating a configuration of a computing system according to an exemplary embodiment of the present invention.

FIG. 14 is a diagram illustrating a configuration of a computing system according to an exemplary embodiment of the present invention.

As illustrated in FIG. 14, a computing system 200 according to an exemplary embodiment of the present invention may include a CPU 220, a RAM 230, a user interface 240, a modem 250, and a memory system 210, which are electrically connected to a system bus 260. Further, in a case where the computing system 200 is a mobile device, the computing system 200 may further include a battery for supplying an operational voltage to the computing system, and may further include an application chip-set, a CMOS image sensor CIS, a mobile DRAM, and the like.

The memory system 210 may be formed of a non-volatile memory device 212 and a memory controller 211 as previously described with reference to FIG. 13.

In the present specification, the structure and manufacturing method of the non-volatile memory device have been described, but the present invention is not limited thereto. The present invention may be applicable to a semiconductor device including stacked conductive layers and slits passing through the conductive layers, and may be applicable to, for example, all of a volatile memory device and a non-volatile memory device.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the scope of the present invention will be defined by the accompanying claims.

What is claimed is:

1. A semiconductor device, comprising: a plurality of first conductive layers stacked on top of one another; a plurality of first slits passing through the first conductive layers in a first direction; and a plurality of second slits passing through the first conductive layers in a second direction crossing the first direction, wherein one end portion of each of the first slits is coupled to one end portion of each of the second slits to compose a line pattern having a curved shape, and one end portion of each of the first slits extends above each of the second slits and one end portion of each of the second slits extends below each of the first slits to form extensions at corners of the line pattern.

2. The semiconductor device of claim 1, wherein the first slits are extended in a first direction, and the second slits are extended in a second direction crossing the first direction.

3. The semiconductor device of claim 1, further comprising one or more of first supporting bodies formed within the second slits.

4. The semiconductor device of claim 1, wherein each of the second slits includes one or more protrusions.

5. The semiconductor device of claim 1, further comprising one or more of third slits positioned between the first slits.

6. The semiconductor device of claim 5, further comprising one or more of second supporting bodies formed within the third slits.

7. The semiconductor device of claim 1, further comprising a second conductive layer formed under the first conductive layers.

8. The semiconductor device of claim 7, further comprising:
one or more dummy trenches formed within the second conductive layer; and
one or more of fourth slits connected with the dummy trenches and passing through the first conductive layers.

9. The semiconductor device of claim 1, further comprising one or more of fifth slits positioned between adjacent memory blocks and including one or more protrusions protruding toward the insides of the memory blocks.

10. The semiconductor device of claim 9, wherein the one or more protrusions are positioned at a contact area.

11. The semiconductor device of claim 9, wherein the one or more protrusions are asymmetrically arranged at both sides of the fifth slits.

12. A semiconductor device, comprising: a substrate in which a cell area and contact area are defined, a plurality of conductive layers stacked on the substrate; and a plurality of slits positioned between adjacent memory blocks, passing through the conductive layers and extended in a first direction, wherein each of the slits includes one or more extensions extending in a second direction crossing the first direction, asymmetrically arranged at both sides of the slits and positioned in the contact area.

13. A semiconductor device, comprising: a substrate in which a cell area and a contact area are defined, wherein the cell area is between the contact areas; a first conductive layer formed over the substrate; a plurality of second conductive patterns stacked on the first conductive layer; a first slit isolating the second conductive patterns from each other; a plurality of dummy trenches formed within the first conductive layer and filled with a first insulating layer, wherein the dummy trenches are located between the cell area and the contact areas; and a plurality of second slits connected with the dummy trenches, passing through the second conductive patterns, filled with a second insulating layer and positioned with the first slit interposed there between.

14. The semiconductor device of claim 13, wherein the dummy trenches are positioned to cross the first slit, and partially overlap end portions of the second conductive patterns.

15. The semiconductor device of claim 13, wherein each of the dummy trenches is connected with at least two second slits.

16. The semiconductor device of claim 13, wherein each of the second slits is connected with at least one dummy trenches.

17. The semiconductor device of claim 13, wherein the first slit has a curved line shape, and the second conductive patterns have an interlaced finger configuration.

18. The semiconductor device of claim 13, wherein the dummy trenches and the second slits are extended in a same direction.

19. The semiconductor device of claim 13, wherein the dummy trenches and the second slits are extended in a direction in which the dummy trenches and the second slits cross each other.

20. The semiconductor device of claim 13, wherein the dummy trenches are located at an edge of the cell area adjacent to a contact area or at a boundary of the cell area and the contact area.

* * * * *